(12) United States Patent
Hsu et al.

(10) Patent No.: US 12,181,797 B2
(45) Date of Patent: Dec. 31, 2024

(54) EXTREME ULTRAVIOLET MASK WITH ALLOY BASED ABSORBERS

(71) Applicant: Taiwan Semiconductor Manufacturing Co., Ltd., Hsinchu (TW)

(72) Inventors: Pei-Cheng Hsu, Hsinchu (TW); Ping-Hsun Lin, Hsinchu (TW); Ta-Cheng Lien, Hsinchu (TW); Hsin-Chang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 164 days.

(21) Appl. No.: 17/483,302

(22) Filed: Sep. 23, 2021

(65) Prior Publication Data

US 2022/0382148 A1 Dec. 1, 2022

Related U.S. Application Data

(60) Provisional application No. 63/194,736, filed on May 28, 2021.

(51) Int. Cl.
*G03F 7/004* (2006.01)
*H01L 21/033* (2006.01)

(52) U.S. Cl.
CPC ........ *G03F 7/0042* (2013.01); *H01L 21/0332* (2013.01); *H01L 21/0337* (2013.01)

(58) Field of Classification Search
CPC . G03F 7/0042; G03F 1/54; G03F 1/24; G03F 1/58; G03F 1/80; H01L 21/0332; H01L 21/0337

See application file for complete search history.

(56) References Cited

U.S. PATENT DOCUMENTS

| 4,555,460 A | * | 11/1985 | Harms | ...................... G03F 1/22 430/5 |
| 2003/0043456 A1 | * | 3/2003 | Singh | ..................... B82Y 10/00 359/359 |

(Continued)

FOREIGN PATENT DOCUMENTS

| JP | 2007108516 A | * | 4/2007 | ............. B82Y 10/00 |
| JP | 2011171457 A | * | 9/2011 | |

(Continued)

OTHER PUBLICATIONS

Erdmann, Andreas [et al.]: Perspectives and tradeoffs of absorber materials for high NA EUV lithography. In: Journal of micro/nanolithograhy, MEMS and MOEMS, vol. 19, 2020, No. 4, Art-No. 041001 S. 1-16.-ISSN.

*Primary Examiner* — Mark F. Huff
*Assistant Examiner* — Moriah S. Smoot
(74) *Attorney, Agent, or Firm* — Seed IP Law Group LLP

(57) ABSTRACT

An extreme ultraviolet mask including a substrate, a reflective multilayer stack on the substrate and a multi-layer patterned absorber layer on the reflective multilayer stack is provided. Disclosed embodiments include an absorber layer that includes an alloy comprising ruthenium (Ru), chromium (Cr), platinum (Pt), gold (Au), iridium (Ir), titanium (Ti), niobium (Nb), rhodium (Rh), molybdenum (Mo), tungsten (W) or palladium (Pd), and at least one alloying element. The at least one alloying element includes ruthenium (Ru), chromium (Cr), tantalum (Ta), platinum (Pt), gold (Au), iridium (Ir), titanium (Ti), niobium (Nb), rhodium (Rh), molybdenum (Mo), hafnium (Hf), boron (B), nitrogen (N), silicon (Si), zirconium (Zr) or vanadium (V). Other embodiments include a multi-layer patterned absorber structure with layers that include an alloy and an alloying element, (Continued)

where at least two of the layers of the multi-layer structure have different compositions.

20 Claims, 31 Drawing Sheets

(56) References Cited

U.S. PATENT DOCUMENTS

| | | | | |
|---|---|---|---|---|
| 2004/0091789 | A1* | 5/2004 | Han | B82Y 10/00 |
| | | | | 430/311 |
| 2006/0222961 | A1* | 10/2006 | Yan | B82Y 40/00 |
| | | | | 430/323 |
| 2013/0157177 | A1* | 6/2013 | Yu | G03F 1/24 |
| | | | | 430/5 |
| 2014/0011121 | A1* | 1/2014 | Yu | G03F 1/24 |
| | | | | 430/5 |
| 2016/0357100 | A1* | 12/2016 | Ikuta | G03F 1/24 |
| 2017/0351169 | A1* | 12/2017 | Yu | G03F 1/24 |
| 2018/0031964 | A1* | 2/2018 | Jindal | G03F 1/24 |
| 2020/0249557 | A1* | 8/2020 | Liu | G03F 1/22 |
| 2021/0026234 | A1 | 1/2021 | Magana et al. | |
| 2021/0072633 | A1* | 3/2021 | Chen | H01L 21/0337 |
| 2021/0124256 | A1 | 4/2021 | Jindal | |

FOREIGN PATENT DOCUMENTS

| | | | | |
|---|---|---|---|---|
| KR | 20180116758 A | | 10/2018 | |
| TW | 201708941 A | * | 3/2017 | B08B 3/02 |
| TW | 201830122 A | | 8/2018 | |
| TW | 202020552 A | | 6/2020 | |
| TW | I708114 B | | 10/2020 | |
| TW | 202109171 A | | 3/2021 | |

\* cited by examiner

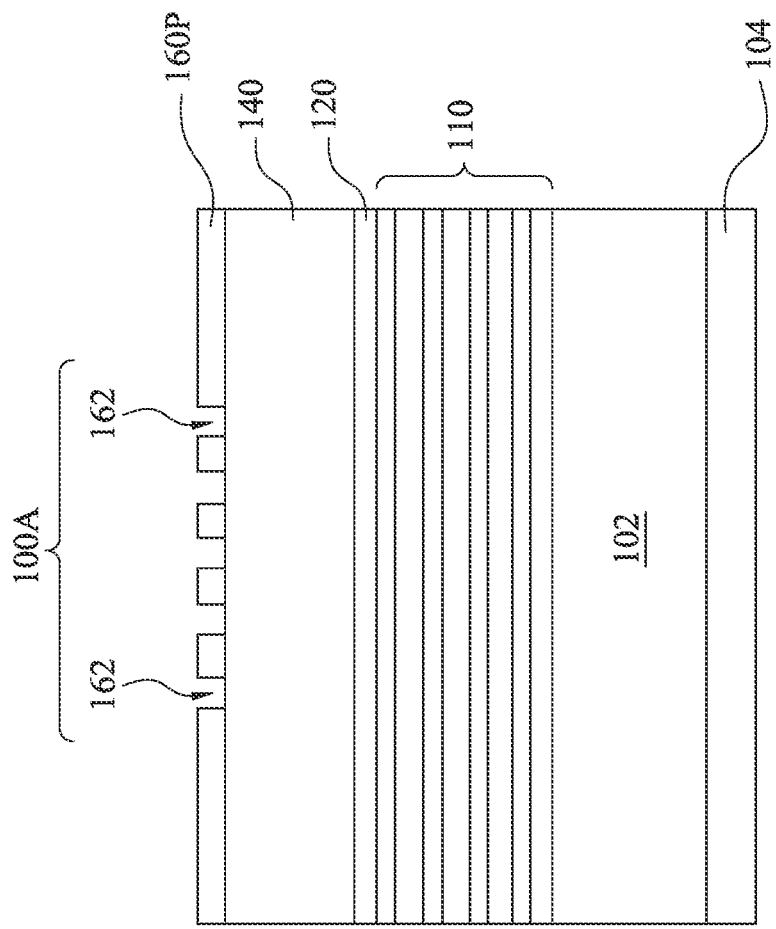

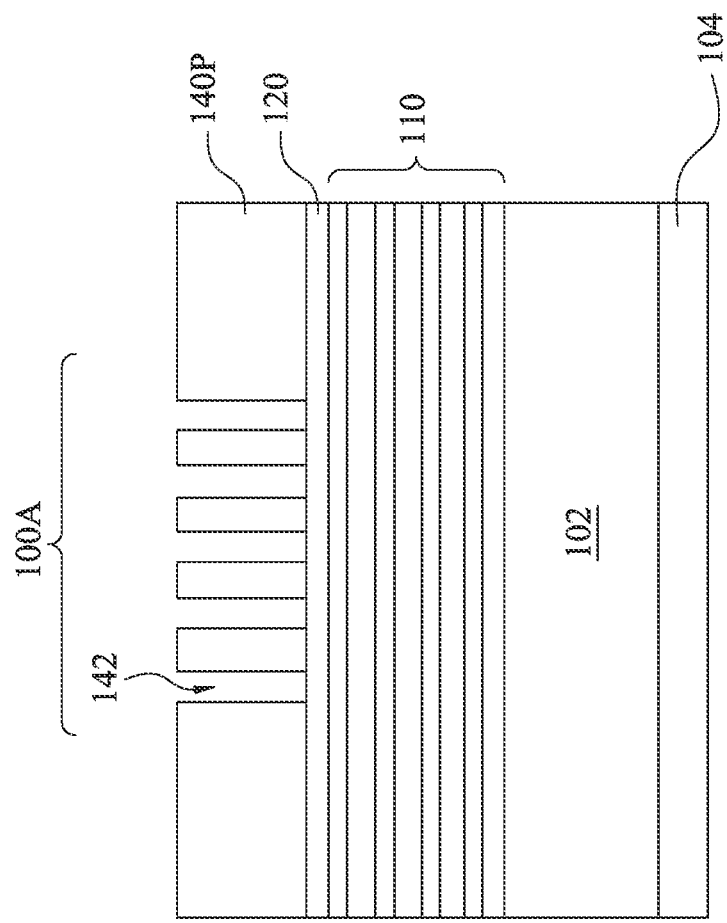

EXTREME ULTRAVIOLET MASK WITH ALLOY BASED ABSORBERS

PRIORITY CLAIM AND CROSS-REFERENCE

This application claims the benefit of U.S. Provisional Patent Application No. 63/194,736, filed May 28, 2021, which is incorporated by reference herein in its entirety.

BACKGROUND

The semiconductor industry has experienced exponential growth. Technological advances in materials and design have produced generations of integrated circuits (ICs), where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6J are cross-sectional views of an EUV mask at various stages of the fabrication process of FIG. 5, in accordance with some embodiments.

DETAILED DESCRIPTION

Figure 1:
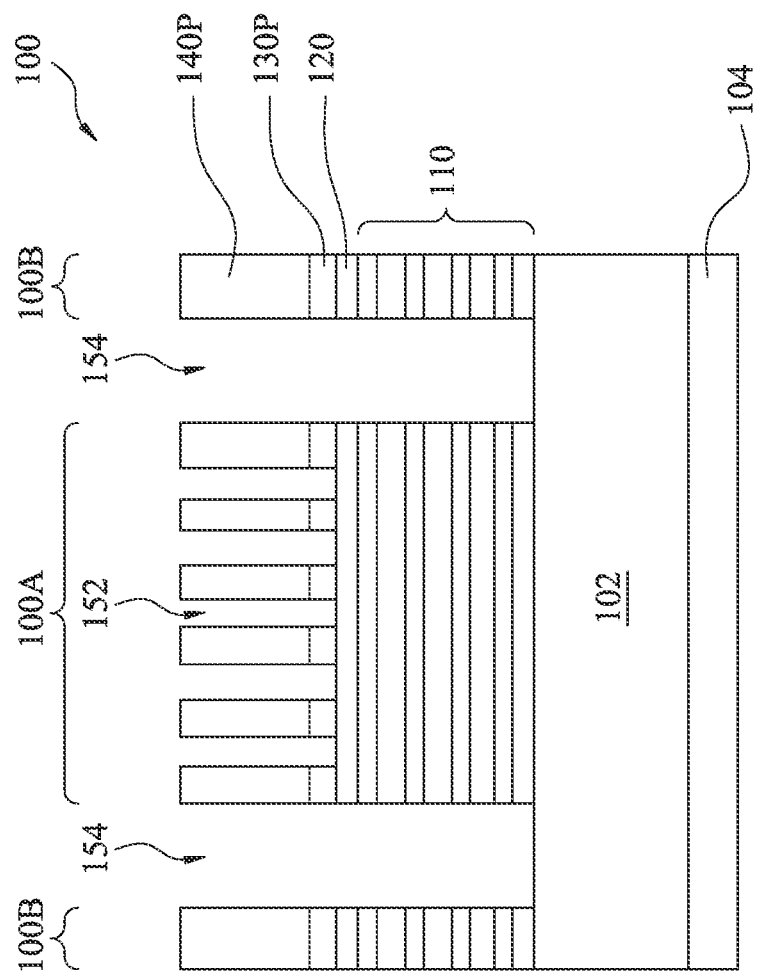
FIG. 1 is a cross-sectional view of an extreme ultraviolet (EUV) mask, in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the manufacture of integrated circuits (ICs), patterns representing different layers of the ICs are fabricated using a series of reusable photomasks (also referred to herein as photolithography masks or masks) in order to transfer the design of each layer of the ICs onto a semiconductor substrate during the semiconductor device fabrication process.

With the shrinkage in IC size, extreme ultraviolet (EUV) light with a wavelength of 13.5 nm is employed in, for example, a lithographic process to enable transfer of very small patterns (e.g., nanometer-scale patterns) from a mask to a semiconductor wafer. Because most materials are highly absorbing at the wavelength of 13.5 nm, EUV lithography utilizes a reflective-type EUV mask having a reflective multilayer to reflect the incident EUV light and an absorber layer on top of the reflective multilayer to absorb radiation in areas where light is not supposed to be reflected by the mask. The reflective multilayer and absorber layer are on a low thermal expansion material substrate. The reflective multilayer reflects the incident EUV light and the patterned absorber layer on top of the reflective multilayer absorbs light in areas where light is not supposed to be reflected by the mask. The mask pattern is defined by the absorber layer and is transferred to a semiconductor wafer by reflecting EUV light off portions of a reflective surface of the EUV mask.

In EUV lithography, to separate the reflected light from the incident light, the EUV mask is illuminated with obliquely incident light that is tilted at a 6-degree angle from normal. The oblique incident EUV light is reflected by the reflective multilayer or absorbed by the absorber layer. In the fabrication of the EUV mask, on that occasion, if the absorber layer is thick, at the time of EUV lithography, a shadow may be formed. For example, the reflected light may be shattered by portions of the absorber layer. The mask shadowing effects, also known as mask 3D effects, can result in unwanted feature-size dependent focus and pattern placement shifts. The mask 3D effects become worse as the technology node advances. With shrinking pattern size, mask 3D effects become stronger, such as horizontal/vertical shadowing.

An ongoing desire to have more densely packed integrated devices has resulted in changes to the photolithography process in order to form smaller individual feature sizes. The minimum feature size or "critical dimension" (CD) obtainable by a process is determined approximately by the formula $CD=k_1*\lambda/NA$, where $k_1$ is a process-specific coefficient, $\lambda$ is the wavelength of applied light/energy, and NA is the numerical aperture of the optical lens as seen from the substrate or wafer.

For fabrication of dense features with a given value of $k_1$, the ability to project a usable image of a small feature onto a wafer is limited by the wavelength $\lambda$ and the ability of the projection optics to capture enough diffraction orders from an illuminated mask. When either dense features or isolated features are made from a photomask or a reticle of a certain size and/or shape, the transitions between light and dark at the edges of the projected image may not be sufficiently sharply defined to correctly form target photoresist patterns. This may result, among other things, in reducing the contrast of aerial images and also the quality of resulting photoresist profiles. As a result, features 150 nm or below in size may need to utilize phase shifting masks (PSMs) or techniques to enhance the image quality at the wafer, e.g., sharpening edges of features to improve resist profiles.

Phase-shifting generally involves selectively changing phases of part of the energy passing through a photomask/reticle so that the phase-shifted energy is additive or subtractive with energy that is not phase-shifted at the surface of the material on the wafer that is to be exposed and patterned. By carefully controlling the shape, location, and phase shift angle of mask features, the resulting photoresist patterns can have more precisely defined edges. As the feature size reduces, an imbalance of transmission intensity between the 0° and 180° phase portions and a phase shift that varies from 180° can result in significant critical dimension (CD) variation and placement errors for the photoresist pattern.

Phase shifts may be obtained in a number of ways. For example, one process known as attenuated phase shifting (AttPSM) utilizes a mask that includes a layer of non-opaque material that causes light passing through the non-opaque material to change in phase compared to light passing through transparent parts of the mask. In addition, the non-opaque material can adjust the amount (intensity/magnitude) of light transmitted through the non-opaque material compared to the amount of light transmitted through transparent portions of the mask.

Another technique is known as alternating phase shift, where the transparent mask material (e.g., quartz or $SiO_2$ substrate) is sized (e.g., etched) to have regions of different depths or thicknesses. The depths are selected to cause a desired relative phase difference in light passing through the regions of different depths/thicknesses. The resulting mask is referred to as an "alternating phase shift mask" or "alternating phase shifting mask" (AltPSM). AttPSMs and AltPSMs are referred to herein as "APSM." The portion of the AltPSM having the thicker depth is referred to as the 0° phase portion, while the portion of the AltPSM having the lesser depth is referred to as the 180° phase portion. The depth difference allows the light to travel half of the wavelength in the transparent material, generating a phase difference of 180° between 0° and 180° portions. In some implementations, a patterned phase shifting material is located above the portions of the transparent mask substrate that has not been etched to different depths. The phase shifting material is a material that affects the phase of the light passing through the phase shifting material such that the phase of the light passing through the phase shifting material is shifted relative to the phase of the light that does not pass through the phase shifting material, e.g., passes only through the transparent mask substrate material without passing through the phase shifting material. The phase shifting material can also reduce the amount of light transmitted through the phase shifting material relative to the amount of incident light that passes through portions of the mask not covered by the phase shifting material.

In embodiments of the present disclosure, absorber layers of a single alloy material or multiple layers of different alloy materials with a high extinction coefficient k in the EUV wavelength range and an index of refraction less than 1 are described. In some embodiments, the base alloy is comprised of a transition metal main alloy element and an alloying element such as a transition metal element, metalloid, or a reactive non-metal. By using these alloys as absorber materials in EUV masks or mask blanks, a thinner absorber layer can be used to reduce the mask 3D effects and exposure energy. As a result, the scanner throughput is improved. In some embodiments, the alloys may be doped with an interstitial element such as nitrogen (N), oxygen (O), carbon (C), or boron (B) to increase the density of the absorber material.

FIG. 1 is a cross-sectional view of an EUV mask 100, in accordance with a first embodiment of the present disclosure. Referring to FIG. 1, the EUV mask 100 includes a substrate 102, a reflective multilayer stack 110 over a front surface of the substrate 102, a capping layer 120 over the reflective multilayer stack 110, a patterned buffer layer 130P over the capping layer 120, and a patterned absorber layer 140P over the patterned buffer layer 130P. The EUV mask 100 further includes a conductive layer 104 over a back surface of the substrate 102 opposite the front surface.

The patterned absorber layer 140P and the patterned buffer layer 130P contain a pattern of openings 152 that correspond to circuit patterns to be formed on a semiconductor wafer. The pattern of openings 152 is located in a pattern region 100A of the EUV mask 100, exposing a surface of the capping layer 120. The pattern region 100A is surrounded by a peripheral region 100B of the EUV mask 100. The peripheral region 100B corresponds to a non-patterned region of the EUV mask 100 that is not used in an exposing process during IC fabrication. In some embodiments, the pattern region 100A of EUV mask 100 is located at a central region of the substrate 102, and the peripheral region 100B is located at an edge portion of the substrate 102. The pattern region 100A is separated from the peripheral region 100B by trenches 154. The trenches 154 extend through the patterned absorber layer 140P, the patterned buffer layer 130P, the capping layer 120, and the reflective multilayer stack 110, exposing the front surface of the substrate 102.

In accordance with some embodiments of the present disclosure, patterned absorber layer 140P is a layer of absorber material that is an alloy of a transition metal, e.g., ruthenium (Ru), chromium (Cr), platinum (Pt), gold (Au), iridium (Ir), titanium (Ti), niobium (Nb), rhodium (Rh), molybdenum (Mo), tungsten (W), or palladium (Pd), and at least one alloying element selected from ruthenium (Ru), chromium (Cr), tantalum (Ta), platinum (Pt), palladium (Pd), tungsten (W), gold (Au), iridium (Ir), titanium (Ti), niobium (Nb), rhodium (Rh), molybdenum (Mo), hafnium (Hf), boron (B), nitrogen (N), silicon (Si), zirconium (Zr), or vanadium (V).

In accordance with some embodiments of the present disclosure, patterned absorber layer 140P includes a first layer of absorber material and a second layer of absorber material different from the first layer of absorber material, the absorber material of the first layer having an index of refraction smaller than 0.95 and an extinction coefficient (k) greater than 0.01. The extinction coefficient k is a function of decay in the amplitude of a light wave propagating in the absorber material. Examples of an absorber material that has an index of refraction smaller than 0.95 and an extinction coefficient greater than 0.01 include an alloy of ruthenium (Ru), chromium (Cr), tantalum (Ta), platinum (Pt), gold (Au), iridium (Ir), titanium (Ti), niobium (Nb), rhodium (Rh), molybdenum (Mo), tungsten (W), or palladium (Pd), and at least one alloying element selected from ruthenium (Ru), chromium (Cr), tantalum (Ta), platinum (Pt), palladium (Pd), tungsten (W), gold (Au), iridium (Ir), titanium (Ti), niobium (Nb), rhodium (Rh), molybdenum (Mo), hafnium (Hf), boron (B), nitrogen (N), silicon (Si), zirconium (Zr), or vanadium (V).

Figure 2:
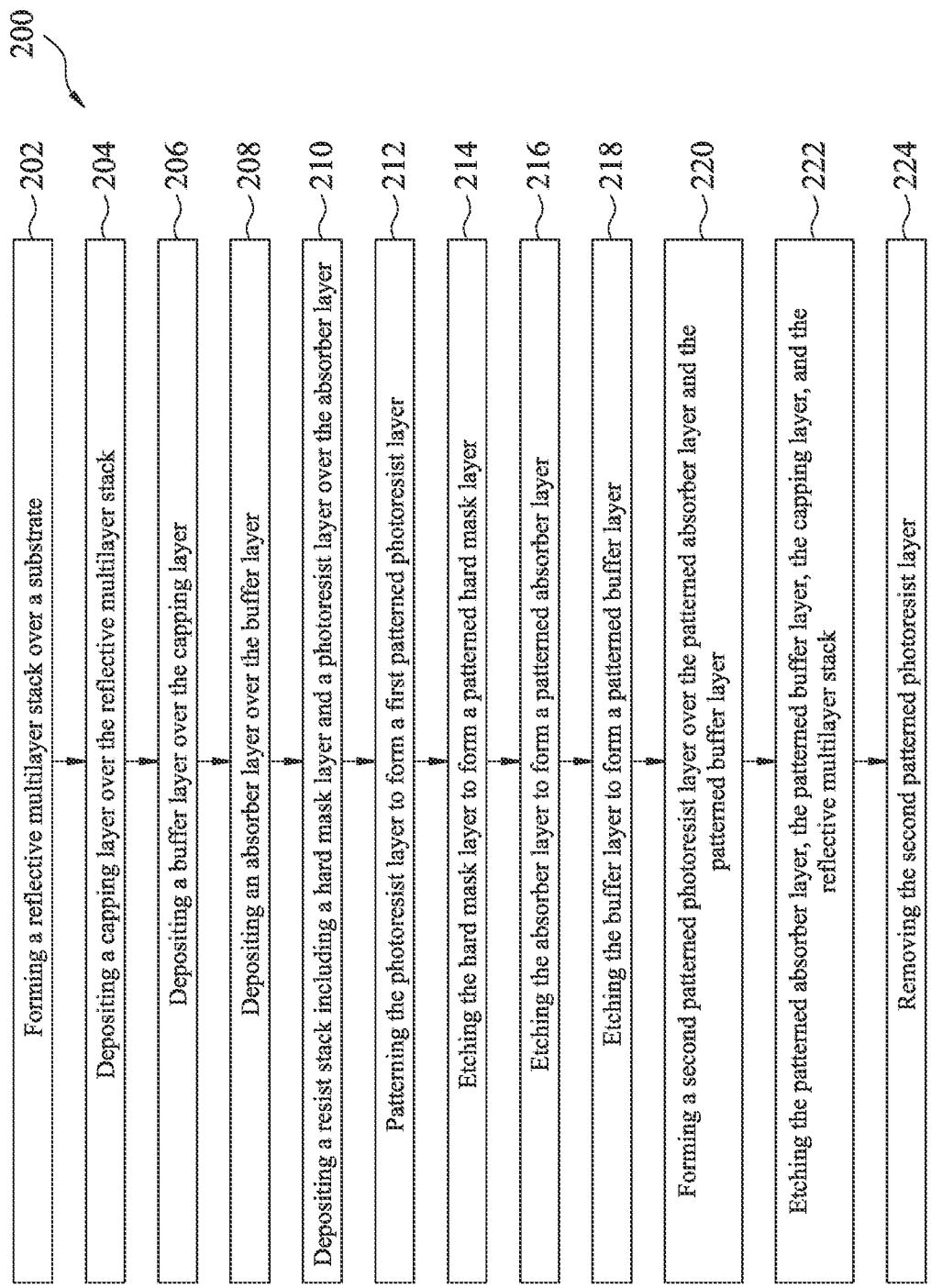
FIG. 2 is a flowchart of a method for fabricating the EUV mask of FIG. 1, in accordance with some embodiments.

FIG. 2 is a flowchart of a method 200 for fabricating an EUV mask with an embodiment of the present disclosure, for example, EUV mask 100. FIG. 3A through FIG. 3L are cross-sectional views of the EUV mask 100 at various stages of the fabrication process, in accordance with some embodiments. The method 200 is discussed in detail below, with reference to the EUV mask 100. In some embodiments, additional operations are performed before, during, and/or after the method 200, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 3A:
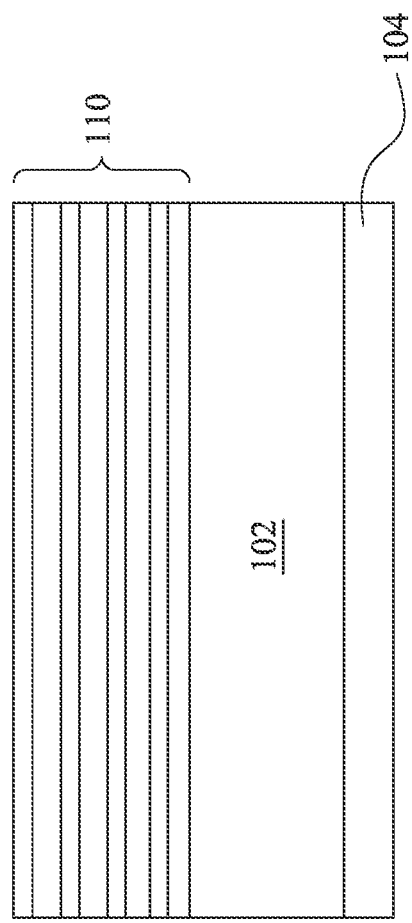
FIGS. 3A-3L are cross-sectional views of an EUV mask at various stages of the fabrication process of FIG. 2, in accordance with some embodiments.

Referring to FIGS. 2 and 3A, the method 200 includes operation 202, in which a reflective multilayer stack 110 is formed over a substrate 102, in accordance with some embodiments. FIG. 3A is a cross-sectional view of an initial structure of an EUV mask 100 after forming the reflective multilayer stack 110 over the substrate 102, in accordance with some embodiments.

Referring to FIG. 3A, the initial structure of the EUV mask 100 includes a substrate 102 made of glass, silicon, quartz, or other low thermal expansion materials. The low thermal expansion material helps to minimize image distortion due to mask heating during use of the EUV mask 100. In some embodiments, the substrate 102 includes fused silica, fused quartz, calcium fluoride, silicon carbide, black diamond, or titanium oxide doped silicon oxide ($SiO_2/TiO_2$). In some embodiments, the substrate 102 has a thickness ranging from about 1 mm to about 7 mm. If the thickness of the substrate 102 is too small, a risk of breakage or warping of the EUV mask 100 increases, in some instances. On the other hand, if the thickness of the substrate is too great, a weight of the EUV mask 100 is needlessly increased, in some instances.

In some embodiments, a conductive layer 104 is disposed on a back surface of the substrate 102. In some embodiments, the conductive layer 104 is in direct contact with the back surface of the substrate 102. The conductive layer 104 is adapted to provide for electrostatically coupling of the EUV mask 100 to an electrostatic mask chuck (not shown) during fabrication and use of the EUV mask 100. In some embodiments, the conductive layer 104 includes chromium nitride (CrN) or tantalum boride (TaB). In some embodiments, the conductive layer 104 is formed by a deposition process such as, for example, chemical vapor deposition (CVD), plasma-enhanced chemical vapor deposition (PECVD), or physical vapor deposition (PVD). The thickness of the conductive layer 104 is controlled such that the conductive layer 104 is optically transparent.

The reflective multilayer stack 110 is disposed over a front surface of the substrate 102 opposite the back surface. In some embodiments, the reflective multilayer stack 110 is in directly contact with the front surface of the substrate 102. The reflective multilayer stack 110 provides a high reflectivity to the EUV light. In some embodiments, the reflective multilayer stack 110 is configured to achieve about 60% to about 75% reflectivity at the peak EUV illumination wavelength, e.g., the EUV illumination at 13.5 nm. Specifically, when the EUV light is applied at an incident angle of 6° to the surface of the reflective multilayer stack 110, the maximum reflectivity of light in the vicinity of a wavelength of 13.5 nm is about 60%, about 62%, about 65%, about 68%, about 70%, about 72%, or about 75%.

In some embodiments, the reflective multilayer stack 110 includes alternatively stacked layers of a high refractive index material and a low refractive index material. A material having a high refractive index has a tendency to scatter EUV light on the one hand, and a material having a low refractive index has a tendency to transmit EUV light on the other hand. Pairing these two type materials together provides a resonant reflectivity. In some embodiments, the reflective multilayer stack 110 includes alternatively stacked layers of molybdenum (Mo) and silicon (Si). In some embodiments, the reflective multilayer stack 110 includes alternatively stacked Mo and Si layers with Si being in the topmost layer. In some embodiments, a molybdenum layer is in direct contact with the front surface of the substrate 102. In other some embodiments, a silicon layer is in direct contact with the front surface of the substrate 102. Alternatively, the reflective multilayer stack 110 includes alternatively stacked layers of Mo and beryllium (Be).

The thickness of each layer in the reflective multilayer stack 110 depends on the EUV wavelength and the incident angle of the EUV light. The thickness of alternating layers in the reflective multilayer stack 110 is tuned to maximize the constructive interference of the EUV light reflected at each interface and to minimize the overall absorption of the EUV light. In some embodiments, the reflective multilayer stack 110 includes from 30 to 60 pairs of alternating layers of Mo and Si. Each Mo/Si pair has a thickness ranging from about 2 nm to about 7 nm, with a total thickness ranging from about 100 nm to about 300 nm.

In some embodiments, each layer in the reflective multilayer stack 110 is deposited over the substrate 102 and underlying layer using ion beam deposition (IBD) or DC magnetron sputtering. The deposition method used helps to ensure that the thickness uniformity of the reflective multilayer stack 110 is better than about 0.85 across the substrate 102. For example, to form a Mo/Si reflective multilayer stack 110, a Mo layer is deposited using a Mo target as the sputtering target and an argon (Ar) gas (having a gas pressure of from $1.3 \times 10^{-2}$ Pa to $2.7 \times 10^{-2}$ Pa) as the sputtering gas with an ion acceleration voltage of from 300 V to 1,500 V at a deposition rate of from 0.03 to 0.30 nm/sec and then a Si layer is deposited using a Si target as the sputtering target and an Ar gas (having a gas pressure of $1.3 \times 10^{-2}$ Pa to $2.7 \times 10^{-2}$ Pa) as the sputtering gas, with an ion acceleration voltage of from 300 V to 1,500 V at a deposition rate of from 0.03 to 0.30 nm/sec. By stacking Si layers and Mo layers in 40 to 50 cycles, each of the cycles comprising the above steps, the Mo/Si reflective multilayer stack is deposited.

Figure 3B:
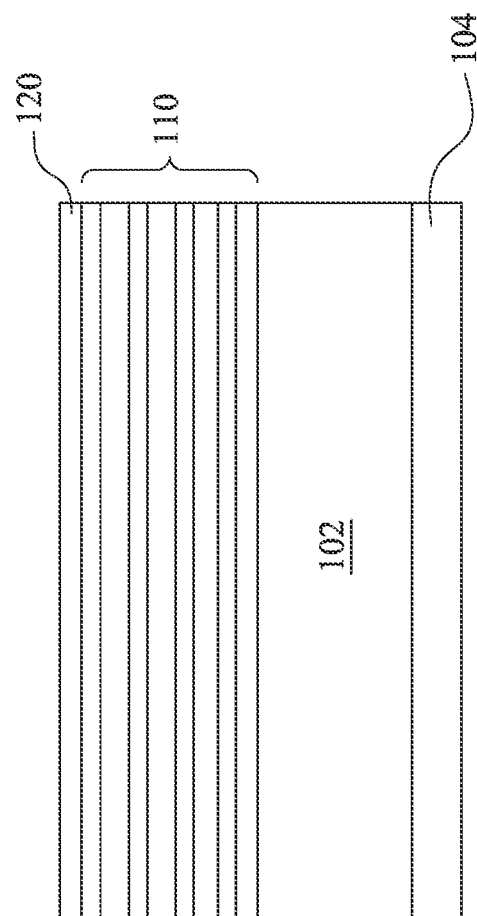

Referring to FIGS. 2 and 3B, the method 200 proceeds to operation 204, in which a capping layer 120 is deposited over the reflective multilayer stack 110, in accordance with some embodiments. FIG. 3B is a cross-sectional view of the structure of FIG. 3A after depositing the capping layer 120 over the reflective multilayer stack 110, in accordance with some embodiments.

Referring to FIG. 3B, the capping layer 120 is disposed over the topmost surface of the reflective multilayer stack 110. The capping layer 120 helps to protect the reflective multilayer stack 110 from oxidation and any chemical etchants to which the reflective multilayer stack 110 may be exposed during subsequent mask fabrication processes.

In some embodiments, the capping layer 120 includes a material that resists oxidation and corrosion, and has a low chemical reactivity with common atmospheric gas species such as oxygen, nitrogen, and water vapor. In some embodiments, the capping layer 120 includes a transition metal such as, for example, ruthenium (Ru), iridium (Ir), rhodium (Rh), platinum (Pt), palladium (Pd), osmium (Os), rhenium (Re), vanadium (V), tantalum (Ta), hafnium (Hf), tungsten (W), molybdenum (Mo), zirconium (Zr), manganese (Mn), technetium (Tc), or alloys thereof.

In some embodiments, the capping layer 120 is formed using a deposition process such as, for example, IBD, chemical vapor deposition (CVD), physical vapor deposition (PVD), or atomic layer deposition (ALD). In instances where a Ru layer is to be formed as the capping layer 120 using IBD, the deposition may be carried out in an Ar atmosphere by using a Ru target as the sputtering target.

Figure 3C:
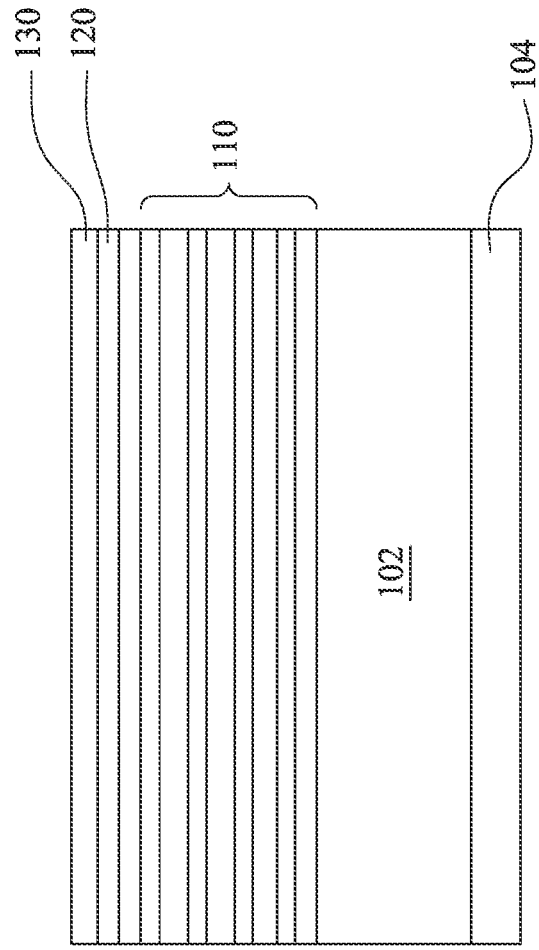

Referring to FIGS. 2 and 3C, the method 200 proceeds to operation 206, in which a buffer layer 130 is deposited over the capping layer 120, in accordance with some embodiments. FIG. 3C is a cross-sectional view of the structure of FIG. 3B after depositing the buffer layer 130 over the capping layer 120, in accordance with some embodiments.

Referring to FIG. 3C, the buffer layer 130 is disposed on the capping layer 120. The buffer layer 130 possesses different etching characteristics from an absorber layer subsequently formed thereon, and thereby serves as an etch stop layer to prevent damages to the capping layer 120 during patterning of an absorber layer subsequently formed thereon. Further, the buffer layer 130 may also serve later as a sacrificial layer for focused ion beam repair of defects in the absorber layer. In some embodiments, the buffer layer 130 includes ruthenium boride (RuB), ruthenium silicide (RuSi), chromium oxide (CrO), or chromium nitride (CrN). In some other embodiments, the buffer layer 130 includes a dielectric material such as, for example, silicon oxide or silicon oxynitride. In some embodiments, the buffer layer 130 is deposited by CVD, PECVD, or PVD. In some embodiments, the buffer layer has a thickness ranging from about 2 to 10 nm. Embodiments in accordance with the present disclosure are not limited to EUV masks that include a buffer layer that has a thickness from two to about 10 nm.

Figure 3D:
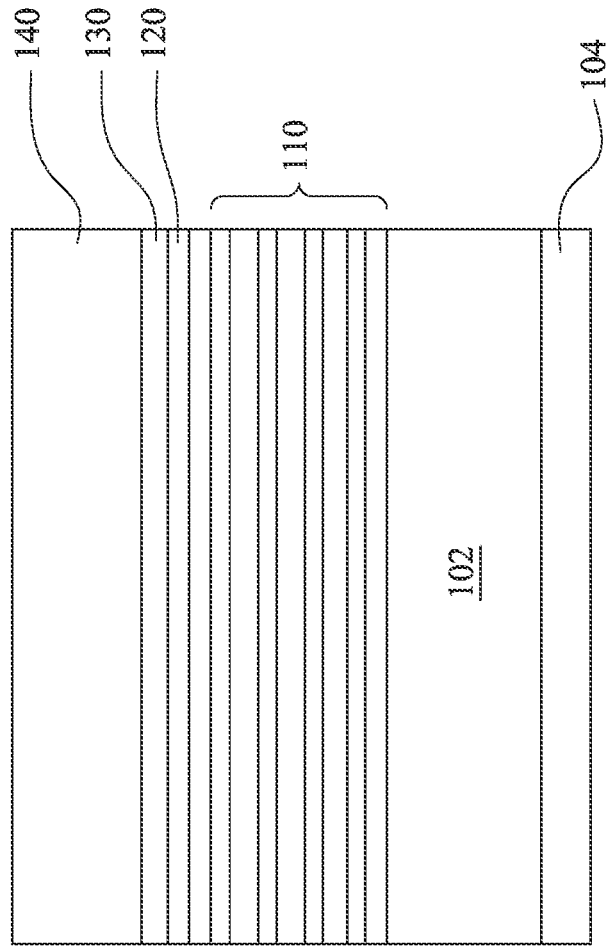

Referring to FIGS. 2 and 3D, the method 200 proceeds to operation 208, in which an absorber layer 140 is deposited over the buffer layer 130, in accordance with various embodiments. FIG. 3D is a cross-sectional view of the structure of FIG. 3C after depositing the absorber layer 140 over the buffer layer 130, in accordance with some embodiments.

Referring to FIG. 3D, the absorber layer 140 is disposed in direct contact with the buffer layer 130. The absorber layer 140 is usable to absorb radiation in the EUV wavelength projected onto the EUV mask 100.

The absorber layer 140 includes an absorber material having a high extinction coefficient K and a low refractive index n for EUV wavelengths. In some embodiments, the absorber layer 140 includes an absorber material having a high extinction coefficient and a low refractive index at 13.5 nm wavelength. In some embodiments, the extinction coefficient k of the absorber material of the absorber layer 140 is greater than 0.01, e.g., in a range from about 0.01 to 0.08. In some embodiments, the refractive index n of the absorber material of the absorber layer 140 is in a range from 0.87 to 1. In accordance with some embodiments of the present disclosure, the index of refraction and the extinction coefficient are in relation to light having a wavelength of about 13.5 nm. In accordance with some embodiments, the thickness of absorber layer 140 is less than about 80 nm. In accordance with other embodiments, the thickness of absorber layer 140 is less than about 60 nm. Other embodiments utilize an absorber layer 140 that is less than about 50 nm.

In some embodiments, the absorber material is in a polycrystalline state characterized by grains, grain boundaries and different phases of formation. In other embodiments, the absorber material is in an amorphous state characterized by grains on the order of less than 5 nanometers or less than 3 nanometers, no grain boundaries, and a single phase. As described below in more detail, in accordance with some embodiments of the present disclosure, the absorber material includes interstitial elements selected from nitrogen (N), oxygen (O), boron (B), carbon (C), or combinations thereof. As used herein, interstitial elements refer to elements which are located at interstices between materials comprising a main alloy and an alloying element of absorber materials formed in accordance with the present disclosure.

In some embodiments, absorber layer 140 includes a first layer of absorber material and a second layer of absorber material different from the first layer of absorber material wherein the absorber material of the first layer has an index of refraction less than about 0.95 and an extinction coefficient of greater than 0.01, e.g., with respect to EUV having a wavelength of about 13.5 nm. In some embodiments, the absorber material of the second layer has a similar index of refraction and extinction coefficient properties. In some embodiments of the present disclosure, the absorber layer 140 includes more than two individual layers of absorber material. For example, in some embodiments, absorber layer 140 includes three, four, or more individual layers of absorber material, for example, five, six, or even more layers. In some embodiments, the composition of each of the different layers of absorber material is different. In some embodiments which include three or more layers of absorber material, the composition of alternating layers of absorber material may be the same or they may be different. In addition, in some embodiments, the thickness of one or more of the individual layers of absorber material are the same. In other embodiments, the thickness of some or all of the individual layers of absorber material are different. In some embodiments, the thickness of the individual layers of absorber material ranges between about 20 to 50 nm. In other embodiments, the thickness of individual layers of absorber material ranges between about 5 and 30 nm. In other embodiments, the thickness of individual layers of absorber material ranges between about 5 and 20 nm.

In other embodiments, the absorber layer 140 includes a single layer of absorber material.

The absorber layer 140 is formed by deposition techniques such as PVD, CVD, ALD, RF magnetron sputtering, DC magnetron sputtering, or IBD. The deposition process can be carried out in the presence of elements described as interstitial elements, such as B or N. Carrying out the deposition in the presence of the interstitial elements results in the interstitial elements being incorporated into the material of the absorber layer 140.

In accordance with embodiments of the present disclosure, multiple combinations of different families of alloy materials that are useful as absorber materials. Each of the different families of different alloys includes a main alloy element selected from a transition metal and at least one alloying element. In accordance with some embodiments, the main alloy element comprises up to 90 atomic percent of the alloy used as an absorber material. In some embodiments, the main alloy element comprises more than 50 atomic percent of the alloy used as an absorber material. In some embodiments, the main alloy element comprises about 50 to 90 atomic percent of the alloy used as an absorber material.

In accordance with some embodiments, the main alloy element is a transition metal selected from ruthenium (Ru), chromium (Cr), tantalum (Ta), platinum (Pt), gold (Au), iridium (Ir), titanium (Ti), niobium (Nb), rhodium (Rh), molybdenum (Mo), tungsten (W), and palladium (Pd). In accordance with some embodiments, the at least one alloying element is a transition metal, metalloid, or reactive nonmetal. Examples of the at least one alloying element that is a transition metal include ruthenium (Ru), chromium (Cr), tantalum (Ta), platinum (Pt), palladium (Pd), tungsten (W), gold (Au), iridium (Ir), titanium (Ti), niobium (Nb), rhodium (Rh), molybdenum (Mo), hafnium (Hf), zirconium (Zr), and vanadium (V). Examples of the at least one alloying element that is a metalloid include boron (B) and silicon (Si). Examples of the at least one alloying element that is a reactive nonmetal includes nitrogen (N).

In accordance with other embodiments, the main alloy element is a transition metal selected from ruthenium (Ru), chromium (Cr), tantalum (Ta), platinum (Pt) or gold (Au). In accordance with these embodiments, the at least one alloying element is a transition metal, metalloid or reactive nonmetal. Examples of the at least one alloying element that is a transition metal include ruthenium (Ru), chromium (Cr), tantalum (Ta), platinum (Pt), palladium (Pd), tungsten (W), gold (Au), iridium (Ir), titanium (Ti), niobium (Nb), rhodium (Rh), molybdenum (Mo), hafnium (Hf), boron (B), nitrogen (N), silicon (Si), zirconium (Zr) or vanadium (V).

In accordance with other embodiments, the main alloy element is a transition metal selected from iridium (Ir), titanium (Ti), niobium (Nb), rhodium (Rh), molybdenum (Mo), tungsten (W) or palladium (Pd). In accordance with these embodiments, the at least one alloying element is a transition metal, metalloid or reactive nonmetal. Examples of the at least one alloying element that is a transition metal include iridium (Ir), titanium (Ti), niobium (Nb), rhodium (Rh), molybdenum (Mo), tungsten (W) or palladium (Pd).

In other embodiments, the main alloy element is a transition metal selected from molybdenum (Mo), tungsten (W) or palladium (Pd). In accordance with these embodiments, the at least one alloying element is a transition metal, a metalloid or reactive nonmetal. Examples of the at least one alloying element that is a transition metal include ruthenium (Ru), palladium (Pd), tungsten (W), iridium (Ir), titanium (Ti), niobium (Nb), rhodium (Rh), molybdenum (Mo), silicon (Si) or zirconium (Zr).

Different materials may be used to etch the different absorber materials of the present disclosure and different materials may be used as hard mask layer with the different absorber materials. For example, in some embodiments, the absorber layer 140 is dry etched with a gas that contains chlorine, such as $Cl_2$ or $BCl_3$, or with a gas that contains fluorine, such as $NF_3$. Ar may be used as a carrier gas. In some embodiments, oxygen ($O_2$) may also be included as the carrier gas. For example, a chlorine-based etchant, chlorine-based plus oxygen etchant, or a mixture of a chlorine-based and fluorine based (e.g., carbon tetrafluoride and carbon tetrachloride) etchant will etch the alloys that include a main alloy element comprising ruthenium (Ru), chromium (Cr), tantalum (Ta), platinum (Pt) or gold (Au), and at least one alloying element selected from ruthenium (Ru), chromium (Cr), tantalum (Ta), platinum (Pt), palladium (Pd), tungsten (W), gold (Au), iridium (Ir), niobium (Nb), rhodium (Rh), molybdenum (Mo), hafnium (Hf) or vanadium (V). In with some embodiments, a fluorine-based etchant is suitable to etch the alloys that include a main alloy element comprising iridium (Ir), titanium (Ti), niobium (Ni) or rhodium (Rh) and at least one alloying element selected from boron (B), nitrogen (N), silicon (Si), tantalum (Ta), zirconium (Zr), niobium (Ni), molybdenum (Mo), rhodium (Rh), titanium (Ti) or ruthenium (Ru). In some embodiments, a fluorine-based or a fluorine-based plus oxygen etchant is suitable to etch the alloys that include a main alloy element comprising molybdenum (Mo), tungsten (W) or palladium (Pd) and at least one alloying element selected from ruthenium (Ru), palladium (Pd), tungsten (W), iridium (Ir), titanium (Ti), niobium (Nb), rhodium (Rh), molybdenum (Mo), silicon (Si) or zirconium (Zr).

In accordance with some embodiments, SiN, TaBO, TaO, SiO, SiON, and SiOB are examples of materials useful as hard mask layer 160 and buffer layer 130 for absorber layer 140 utilizing alloys that include a main alloy element comprising ruthenium (Ru), chromium (Cr), tantalum (Ta), platinum (Pt) or gold (Au), and at least one alloying element selected from ruthenium (Ru), chromium (Cr), tantalum (Ta), platinum (Pt), palladium (Pd), tungsten (W), gold (Au), iridium (Ir), niobium (Nb), rhodium (Rh), molybdenum (Mo), hafnium (Hf) or vanadium (V). CrO and CrON are examples of materials useful for hard mask layer 160 and buffer layer 130 of an absorber layer 140 that utilizes alloys that include a main alloy element comprising iridium (Ir), titanium (Ti), niobium (Ni) or rhodium (Rh) and at least one alloying element selected from boron (B), nitrogen (N), silicon (Si), tantalum (Ta), zirconium (Zr), niobium (Ni), molybdenum (Mo), rhodium (Rh), titanium (Ti) or ruthenium (Ru). SiN, TaBO, TaO, CrO, and CrON are examples of materials useful for hard mask layer 160 and buffer layer 130 of an absorber layer 140 that utilizes alloys that include a main alloy element comprising molybdenum (Mo), tungsten (W) or palladium (Pd) and at least one alloying element selected from ruthenium (Ru), palladium (Pd), tungsten (W), iridium (Ir), titanium (Ti), niobium (Nb), rhodium (Rh), molybdenum (Mo), silicon (Si) or zirconium (Zr). In some embodiments, the same material may be used for hard mask layer 160 and buffer layer 130. In other embodiments, the material of hard mask layer 160 is different from the material of buffer layer 130. Embodiments in accordance with the present invention are not limited to the foregoing types of material for buffer layer 130 and hard mask layer 160.

Figure 7:
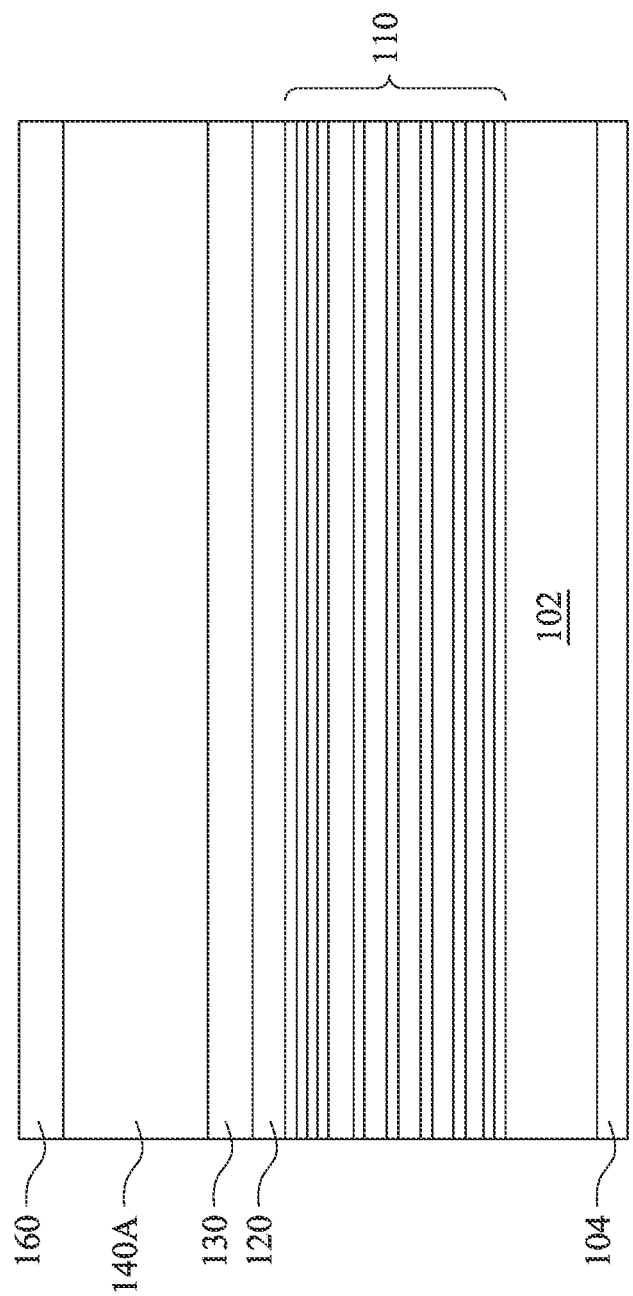
FIG. 7 is a cross-sectional view of an extreme ultraviolet (EUV) mask including a single layer of absorber material at an intermediate stage of manufacture in accordance with some embodiments.

Referring to FIG. 7, an embodiment of an EUV mask of the present disclosure at the stage of manufacture illustrated in FIG. 3D of the present disclosure is illustrated. The absorber layer 140A in FIG. 7 includes a single layer of material selected from the alloys that include a main alloy element of a transition metal selected from ruthenium (Ru), chromium (Cr), platinum (Pt), gold (Au), iridium (Ir), titanium (Ti), niobium (Nb), rhodium (Rh), molybdenum (Mo), tungsten (W), or palladium (Pd), and at least one alloying element selected from ruthenium (Ru), chromium (Cr), tantalum (Ta), platinum (Pt), palladium (Pd), tungsten (W), gold (Au), iridium (Ir), titanium (Ti), niobium (Nb), rhodium (Rh), molybdenum (Mo), hafnium (Hf), boron (B), nitrogen (N), silicon (Si), zirconium (Zr), or vanadium (V). In accordance with some embodiments in accordance with FIG. 7, the absorber layer 140A has a thickness less than 50 nm. In other embodiments, the absorber layer 140A has a thickness that is greater than 20 nm. In some embodiments in accordance with FIG. 7, absorber layer 140 has a thickness between about 20 nm and 50 nm. In accordance with some embodiments of FIG. 7, buffer layer 130 is selected from SiN, TaBO, TaO, SiO, SiON, SiOB, CrON, and CrN. In accordance with some embodiments of FIG. 7, the hard mask layer 160 is selected from the same materials that are useful as buffer layer 130. When the material of the buffer layer 130 is the same as the material of a hard mask layer 160, etching of the patterned buffer layer 130P also removes patterned hard mask layer 160 at step 218 of FIG. 2 (see also, FIG. 3I). In accordance with other embodiments, the material of buffer layer 130 is not the same in composition as the material used as hard mask layer 160.

Figure 8:
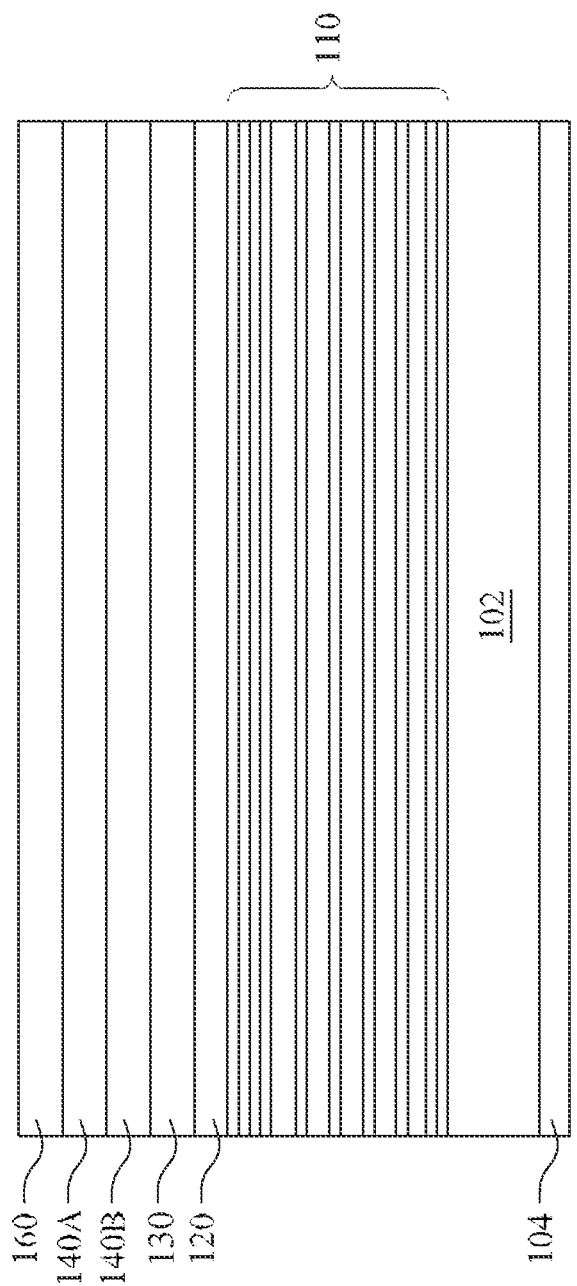
FIG. 8 is a cross-sectional view of an extreme ultraviolet (EUV) mask including two layers of absorber material at an intermediate stage of manufacture in accordance with some embodiments.

Referring to FIG. 8, an embodiment of an EUV mask of the present disclosure at the stage of manufacture illustrated in FIG. 3D of the present disclosure is illustrated. The absorber layer in FIG. 8 includes two layers 140A and 140B of absorber material selected from the alloys including a main alloy element of a transition metal selected from ruthenium (Ru), chromium (Cr), tantalum (Ta), platinum (Pt), or gold (Au), and at least one alloying element selected from ruthenium (Ru), chromium (Cr), tantalum (Ta), platinum (Pt), palladium (Pd), tungsten (W), gold (Au), iridium (Ir), niobium (Nb), rhodium (Rh), molybdenum (Mo), hafnium (Hf), or vanadium (V). In accordance with the embodiments of FIG. 8, the alloy of layer 140A of absorber material is different from the alloy of layer 140B of absorber material. In accordance with some embodiments in accordance with FIG. 8, the absorber layers 140A and 140B have a thickness less than 30 nm. In other embodiments, the absorber layers 140A and 140B have a thickness that is greater than 20 nm. In some embodiments in accordance with FIG. 8, absorber layers 140A and 140B have a thickness between about 20 nm and 50 nm. In accordance with this embodiment of FIG. 8, buffer layer 130 is selected from SiN, TaBO, TaO, SiON, and SiOB. In accordance with this embodiment of FIG. 8, the hard mask layer 160 is selected from the same materials that are useful as buffer layer 130. When the material of the buffer layer 130 is the same as the material of a hard mask layer 160, etching of the patterned buffer layer 130P also removes patterned hard mask layer 160 at step 218 of FIG. 2 (see also, FIG. 3I). In accordance with other embodiments, the material of buffer layer 130 is not the same in composition as the material used as hard mask layer 160.

Referring to FIG. 8, an embodiment of an EUV mask of the present disclosure at the stage of manufacture illustrated in FIGS. 3D of the present disclosure is illustrated. The absorber layer in FIG. 8 includes two layers 140A and 140B of absorber material selected from the alloys that include a main alloy element of a transition metal selected from iridium (Ir), titanium (Ti), niobium (Nb), rhodium (Rh), molybdenum (Mo), tungsten (W), or palladium (Pd), and at least one alloying element selected from ruthenium (Ru), tantalum (Ta), palladium (Pd), tungsten (W), iridium (Ir), titanium (Ti), niobium (Nb), rhodium (Rh), molybdenum (Mo), boron (B), nitrogen (N), silicon (Si), or zirconium (Zr). In accordance with these embodiments of FIG. 8, the alloy of layer 140A of absorber material is different from the alloy of layer 140B of absorber material. In accordance with some embodiments in accordance with FIG. 8, the absorber layers 140A and 140B have a thickness less than 30 nm. In other embodiments, the absorber layers 140A and 140B have a thickness that is greater than 20 nm. In some embodiments in accordance with FIG. 8, absorber layers 140A and 140B have a thickness between about 20 nm and 50 nm. In accordance with these embodiments of FIG. 8, buffer layer 130 is selected from SiN, TaBO, TaO, SiON, SiOB, CrON, and CrN. In accordance with this embodiment of FIG. 8, the hard mask layer 160 is selected from the same materials that are useful as buffer layer 130. When the material of the buffer layer 130 is the same as the material of a hard mask layer 160, etching of the patterned buffer layer 130P also removes patterned hard mask layer 160 at step 218 of FIG. 2 (see also, FIG. 3I). In accordance with other embodiments, the material of buffer layer 130 is not the same in composition as the material used as hard mask layer 160. The embodiments described herein regarding the alloys of families ABS06-ABS12 differ from the embodiments described herein regarding the alloys of families ABS01-ABS05 in that the former are described as being etched by fluorine based etchants whereas the latter are described as being etched by chlorine-based etchants. The alloys of families ABS01-ABS05 are described as utilizing materials for a hard mask layer and a buffer layer that are in common with the materials described as useful as a hard mask layer and a buffer layer for alloys of families ABS06-ABS12.

In accordance with another embodiment of an EUV mask of the present disclosure in accordance with FIG. 8, the absorber layer in FIG. 8 includes two layers 140A and 140B of absorber material selected from the alloys that include a main alloy element of a transition metal selected from molybdenum (Mo), tungsten (W), or palladium (Pd), and at least one alloying element selected from ruthenium (Ru), palladium (Pd), tungsten (W), iridium (Ir), titanium (Ti), niobium (Nb), rhodium (Rh), molybdenum (Mo), silicon (Si), or zirconium (Zr). In accordance with these embodiments of FIG. 8, the alloy of layer 140A of absorber material is different from the alloy of layer 140B of absorber material. In accordance with some embodiments in accordance with FIG. 8, the absorber layers 140A and 140B have a thickness less than 30 nm. In other embodiments, the absorber layers 140A and 140B have a thickness that is greater than 20 nm. In some embodiments in accordance with FIG. 8, absorber layers 140A and 140B have a thickness between about 20 nm and 50 nm. In accordance with these embodiments of FIG. 8, buffer layer 130 is selected from SiN, TaBO, TaO, CrON, and CrN. In accordance with this embodiment of FIG. 8, the hard mask layer 160 is selected from the same materials that are useful as buffer layer 130. When the material of the buffer layer 130 is the same as the material of a hard mask layer 160, etching of the patterned buffer layer 130P also removes patterned hard mask layer 160 at step 218 of FIG. 2 (see also, FIG. 3I). In accordance with other embodiments, the material of buffer layer 130 is not the same in composition as the material used as hard mask layer 160. The alloys that include a main alloy element of a transition metal selected from molybdenum (Mo), tungsten (W), or palladium (Pd), and at least one alloying element selected from ruthenium (Ru), palladium (Pd), tungsten (W), iridium (Ir), titanium (Ti), niobium (Nb), rhodium (Rh), molybdenum (Mo), silicon (Si), or zirconium (Zr) are a subset of the alloys that include a main alloy element of a transition metal selected from iridium (Ir), titanium (Ti), niobium (Nb), rhodium (Rh), molybdenum (Mo), tungsten (W), or palladium (Pd), and at least one alloying element selected from ruthenium (Ru), tantalum (Ta), palladium (Pd), tungsten (W), iridium (Ir), titanium (Ti), niobium (Nb), rhodium (Rh), molybdenum (Mo), boron (B), nitrogen (N), silicon (Si), or zirconium (Zr). The alloys of this latter group are described as utilizing CrON and CrN as materials for the hard mask layer and buffer layer. In contrast, the alloys the former group are described as utilizing not only CrON and CrN as materials for the hard mask layer and buffer layer, but also SiN, TaBO and TaO as materials for the hard mask layer and buffer layer.

Figure 9:
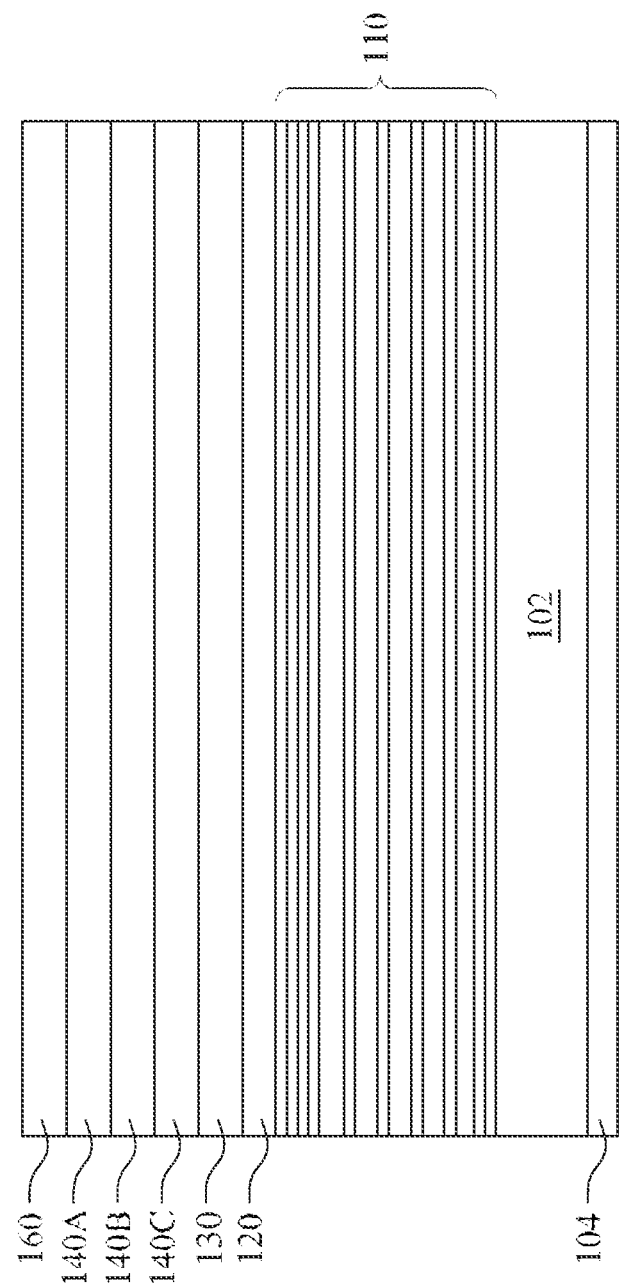
FIG. 9 is a cross-sectional view of an extreme ultraviolet (EUV) mask including three layers of absorber material at an intermediate stage of manufacture in accordance with some embodiments.

Referring to FIG. 9, an embodiment of an EUV mask of the present disclosure at the stage of manufacture illustrated in FIG. 3D of the present disclosure is illustrated. The absorber layer in FIG. 9 includes three layers 140A, 140B and 140C of absorber material selected from the alloys that include a main alloy element comprising ruthenium (Ru), chromium (Cr), tantalum (Ta), platinum (Pt) or gold (Au), and at least one alloying element selected from ruthenium (Ru), chromium (Cr), tantalum (Ta), platinum (Pt), palladium (Pd), tungsten (W), gold (Au), iridium (Ir), niobium (Nb), rhodium (Rh), molybdenum (Mo), hafnium (Hf) or vanadium (V). Such alloys have been described above and are not described again herein. In accordance with an embodiment of FIG. 9, the alloy of layers 140A of absorber material, the alloy of layer 140B of absorber material and the alloy of layer 140C are different in composition. In accordance with some embodiments in accordance with FIG. 9, the absorber layers 140A and 140C are of the same composition that is different from the composition of absorber layer 140B. The description of the thickness of absorber layers 140A and 140B above is equally applicable to the thickness of absorber layer 140C and is not repeated here. The composition of the buffer layer 130 and hard mask layer 160 for an alloy that include a main alloy element comprising ruthenium (Ru), chromium (Cr), tantalum (Ta), platinum (Pt) or gold (Au), and at least one alloying element selected from ruthenium (Ru), chromium (Cr), tantalum (Ta), platinum (Pt), palladium (Pd), tungsten (W), gold (Au), iridium (Ir), niobium (Nb), rhodium (Rh), molybdenum (Mo), hafnium (Hf) or vanadium (V) described above with reference to FIG. 8 is equally applicable to the buffer layer 130 and hard mask layer 160 of FIG. 9 and is not reproduced here.

In accordance with other embodiments of FIG. 9, the absorber layer includes three layers 140A, 140B and 140C of absorber material selected from the alloys that include a main alloy element of a transition metal selected from iridium (Ir), titanium (Ti), niobium (Nb), rhodium (Rh), molybdenum (Mo), tungsten (W), or palladium (Pd), and at least one alloying element selected from ruthenium (Ru), tantalum (Ta), palladium (Pd), tungsten (W), iridium (Ir), titanium (Ti), niobium (Nb), rhodium (Rh), molybdenum (Mo), boron (B), nitrogen (N), silicon (Si), or zirconium (Zr). Such alloys have been described above and are not described again herein. In accordance with these embodiments of FIG. 9, the alloy of layers 140A of absorber material, and the alloy of layer 140B of absorber material in the alloy of layer 140C are different in composition. In accordance with these embodiments in accordance with FIG. 9, the absorber layers 140A and 140C are of the same composition that is different from the composition of absorber layer 140B. The description of the thickness of absorber layers 140A and 140B above is equally applicable to the thickness of absorber layer 140C and is not repeated here. The composition of the buffer layer 130 and hard mask layer 160 for the alloy families referenced in this paragraph have been described above with reference to FIG. 8 is equally applicable to the buffer layer 130 and hard mask layer 160 of FIG. 9 and is not reproduced here.

In accordance with other embodiments of FIG. 9, the absorber layer includes three layers 140A, 140B and 140C of absorber material selected from the alloys that include a main alloy element of a transition metal selected from molybdenum (Mo), tungsten (W), or palladium (Pd), and at least one alloying element selected from ruthenium (Ru), palladium (Pd), tungsten (W), iridium (Ir), titanium (Ti), niobium (Nb), rhodium (Rh), molybdenum (Mo), silicon (Si), or zirconium (Zr). Such alloys have been described above and are not described again herein. In accordance with these embodiments of FIG. 9, the alloy of layers 140A of absorber material, the alloy of layer 140B of absorber material in the alloy of layer 140C are different in composition. In accordance with these embodiments in accordance with FIG. 9, the absorber layers 140A and 140C are of the same composition that is different from the composition of absorber layer 140B. The description of the thickness of absorber layers 140A and 140B above is equally applicable to the thickness of absorber layer 140C and is not repeated here. The composition of the buffer layer 130 and hard mask layer 160 for alloy families referenced in this paragraph and described above with reference to FIG. 8 is equally applicable to the buffer layer 130 and hard mask layer 160 of FIG. 9 and is not reproduced here.

Figure 10:
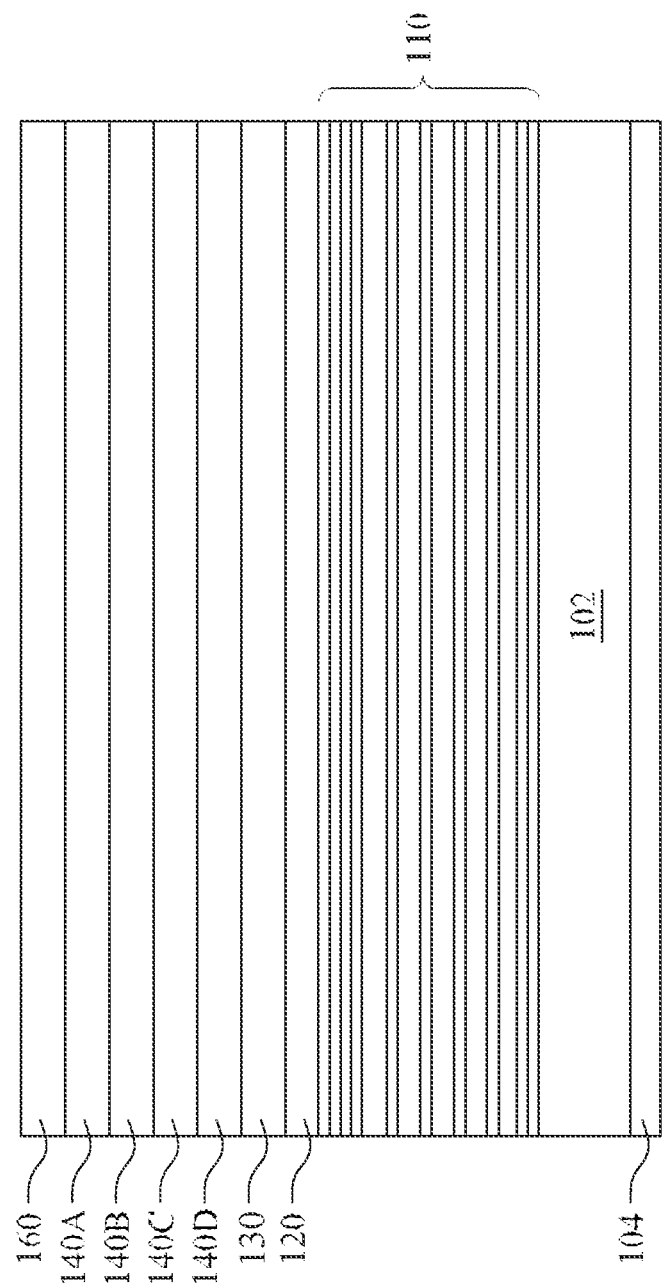
FIG. 10 is a cross-sectional view of an extreme ultraviolet (EUV) mask including four layers of absorber material at an intermediate stage of manufacture in accordance with some embodiments.

Referring to FIG. 10, an embodiment of an EUV mask of the present disclosure at the stage of manufacture illustrated in FIG. 3D of the present disclosure is illustrated. The absorber layer in FIG. 10 includes four layers 140A, 140B, 140C and 140D of absorber material selected from the alloys that include a main alloy element comprising ruthenium (Ru), chromium (Cr), tantalum (Ta), platinum (Pt) or gold (Au), and at least one alloying element selected from ruthenium (Ru), chromium (Cr), tantalum (Ta), platinum (Pt), palladium (Pd), tungsten (W), gold (Au), iridium (Ir), niobium (Nb), rhodium (Rh), molybdenum (Mo), hafnium (Hf) or vanadium (V). Such alloys have been described above and are not described again herein. In accordance with an embodiments of FIG. 10, the alloy of alternating layers may have the same composition. For example, layers 140A and 140C can have the same composition. Similarly, layers 140B and 140D can have similar compositions. In other embodiments, layers 140A-140D have different compositions. The description of the thickness of absorber layers 140A and 140B above is equally applicable to the thickness of absorber layer 140C and absorber layer 140D and is not repeated here. The composition of the buffer layer 130 and hard mask layer 160 for the alloy families described in this paragraph and described above with reference to FIG. 8 is equally applicable to the buffer layer 130 and hard mask layer 160 of FIG. 10 and is not reproduced here.

In accordance with other embodiments of FIG. 10, the absorber layer includes four layers 140A, 140B, 140C and 140D of absorber material selected from the alloys that include a main alloy element of a transition metal selected from iridium (Ir), titanium (Ti), niobium (Nb), rhodium (Rh), molybdenum (Mo), tungsten (W), or palladium (Pd), and at least one alloying element selected from ruthenium (Ru), tantalum (Ta), palladium (Pd), tungsten (W), iridium (Ir), titanium (Ti), niobium (Nb), rhodium (Rh), molybdenum (Mo), boron (B), nitrogen (N), silicon (Si), or zirconium (Zr). Such alloys have been described above and are not described again herein. In accordance with an embodiment of FIG. 10, the alloy of alternating layers may have the same composition. For example, layers 140A and 140C can have the same composition. Similarly, layers 140B and 140D can have similar compositions. In other embodiments, layers 140A-140D have different compositions. The description of the thickness of absorber layers 140A and 140B above is equally applicable to the thickness of absorber layer 140C and absorber layer 140D and is not repeated here. The composition of the buffer layer 130 and hard mask layer 160 for alloy families referenced in this paragraph and described above with reference to FIG. 8 is equally applicable to the buffer layer 130 and hard mask layer 160 of FIG. 10 and is not reproduced here.

In accordance with other embodiments of FIG. 10, the absorber layer includes four layers 140A, 140B, 140C and 140D of absorber material selected from the alloys that include a main alloy element of a transition metal selected from molybdenum (Mo), tungsten (W), or palladium (Pd), and at least one alloying element selected from ruthenium (Ru), palladium (Pd), tungsten (W), iridium (Ir), titanium (Ti), niobium (Nb), rhodium (Rh), molybdenum (Mo), silicon (Si), or zirconium (Zr). Such alloys have been described above and are not described again herein. In accordance with an embodiment of FIG. 10, the alloy of alternating layers may have the same composition. For example, layers 140A and 140C can have the same composition. Similarly, layers 140B and 140D can have similar compositions. In other embodiments, layers 140A-140D have different compositions. The description of the thickness of absorber layers 140A and 140B above is equally applicable to the thickness of absorber layer 140C and absorber layer 140D and is not repeated here. The composition of the buffer layer 130 and hard mask layer 160 for alloy referenced in this paragraph and described above with reference to FIG. 8 is equally applicable to the buffer layer 130 and hard mask layer 160 of FIG. 10 and is not reproduced here.

Embodiments in accordance with the present disclosure are not limited to absorber layers 140 that include only 1 to 4 layers. In other embodiments, EUV masks including an absorber layer that includes more than one to four layers of absorber material is contemplated.

In some embodiments, the absorber layer 140 includes or is made of a Ta-based alloy comprised of Ta and at least one alloying element. In some embodiments, the Ta-based alloy is a Ta-rich alloy having a Ta concentration ranging from greater than 50 atomic % and up to 90 atomic %. In other embodiments, the Ta-based alloy is an alloying element-rich alloy having an alloying element concentration ranging from more than 50 atomic % and up to 90 atomic %.

In some embodiments, the Ta-based alloy is comprised of Ta and at least one transition metal element. Examples of transition metal elements include, but are not limited to titanium (Ti), zirconium (Zr), hafnium (Hf), vanadium (V), niobium (Nb), chromium (Cr), molybdenum (Mo), tungsten (W), iron (Fe), ruthenium (Ru), cobalt (Co), rhodium (Rh), iridium (Ir), nickel (Ni), palladium (Pd), platinum (Pt), and gold (Au). In some embodiments, the Ta-based alloy includes tantalum chromium (TaCr), tantalum hafnium (TaHf), tantalum iridium (TaIr), tantalum nickel (TaNi), tantalum ruthenium (TaRu), tantalum cobalt (TaCo), tantalum gold (TaAu), tantalum molybdenum (TaMo), tantalum tungsten (TaW), tantalum iron (TaFe), tantalum rhodium (TaRh), tantalum vanadium (TaV), tantalum niobium (TaNb), tantalum palladium (TaPd), tantalum zirconium (TaZr), tantalum titanium (TaTi), or tantalum platinum (TaPt). Other examples of tantalum-based alloys include nitrides, oxides, borides and carbides of the foregoing examples of tantalum based alloys, for example, tantalum chromium nitride (TaCrN) or tantalum chromium oxynitride (TaCrON).

In some embodiments, the Ta-based alloy is further doped with one or more interstitial elements such as boron (B), carbon (C), nitrogen (N), and oxygen (O). The interstitial element dopants increase the material density, which leads to an increase in the strength of the resulting alloy. In some embodiments, the absorber layer 140 is comprised of Ta, the alloying element and nitrogen. For example, in some embodiments, the absorber layer 140 includes TaCrN, TaHfN, TaIrN, TaNiN, TaRuN, TaCON, TaAuN, TaMoN, TaWN, TaFeN, TaRhN, TaVN, TaNbN, TaPdN, TaZrN, TaTiN, TaPtN, or TaSiN. In some embodiments, the absorber layer 140 is comprised of Ta, the alloying element, nitrogen, and oxygen. For example, in some embodiments, the absorber layer 140 includes TaCrON, TaHfON, TaIrON, TaNiON, TaRuON, TaCoON, TaAuON, TaMoON, TaWON, TaFeON, TaRhON, TaVON, TaNbON, TaPdON, TaZrON, TaTiON, TaPtON, or TaSiON.

The absorber layer 140 is deposited as an amorphous layer. By maintaining an amorphous phase, the overall roughness of the absorber layer 140 is improved. The thickness of the absorber layer 140 is controlled to provide between 95% and 99.5% absorption of the EUV light at 13.5 nm. In some embodiments, the absorber layer 140 may have a thickness ranging from about 5 nm to about 50 nm. If the thickness of the absorber layer 140 is too small, the absorber layer 140 is not able to absorb a sufficient amount of the EUV light to generate contrast between the reflective areas and non-reflective areas. On the other hand, if the thickness of the absorber layer 140 is too great, the precision of a pattern to be formed in the absorber layer 140 tends to be low.

In embodiments of the present disclosure, by using alloys in accordance with embodiments of the present disclosure having a high extinction coefficient k as the absorber material, the mask 3D effects caused by EUV phase distortion can be reduced. As a result, the best focus shifts and pattern placement error can be reduced, while the normalized image log-slope (NILS) can be increased.

Figure 3E:
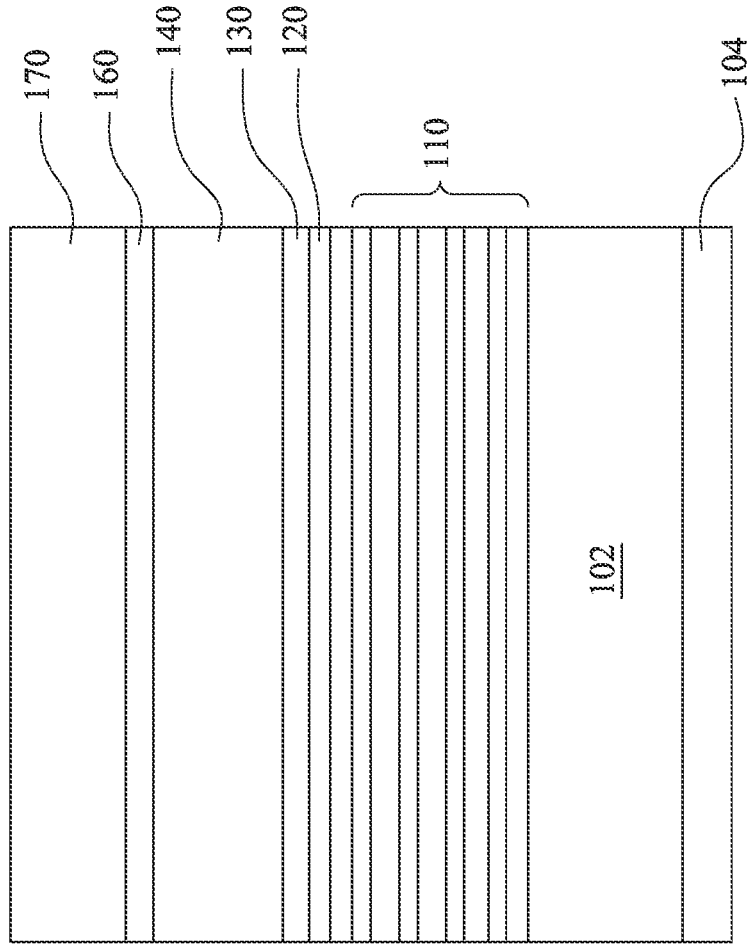

Referring to FIGS. 2 and 3E, the method 200 proceeds to operation 210, in which a resist stack including a hard mask layer 160 and a photoresist layer 170 is deposited over the absorber layer 140, in accordance with some embodiments. FIG. 3E is a cross-sectional view of the structure of FIG. 3D after sequentially depositing the hard mask layer 160 and the photoresist layer 170 over the absorber layer 140, in accordance with some embodiments.

Referring to FIG. 3E, the hard mask layer 160 is disposed over the absorber layer 140. In some embodiments, the hard mask layer 160 is in direct contact with the absorber layer 140. In some embodiments, the hard mask layer 160 includes a dielectric oxide such as silicon dioxide or a dielectric nitride such as silicon nitride. In some embodiments, the hard mask layer 160 is formed using a deposition process such as, for example, CVD, PECVD, or PVD. In some embodiments, the hard mask layer 160 has a thickness ranging from about 2 to 10 nm. Embodiments in accordance with the present disclosure are not limited to hard mask layer 160 having a thickness ranging from about 2 to 10 nm.

The photoresist layer 170 is disposed over the hard mask layer 160. The photoresist layer 170 includes a photosensitive material operable to be patterned by radiation. In some embodiments, the photoresist layer 170 includes a positive-tone photoresist material, and a negative-tone photoresist material or a hybrid-tone photoresist material. In some embodiments, the photoresist layer 170 is applied to the surface of the hard mask layer 160, for example, by spin coating.

Figure 3F:
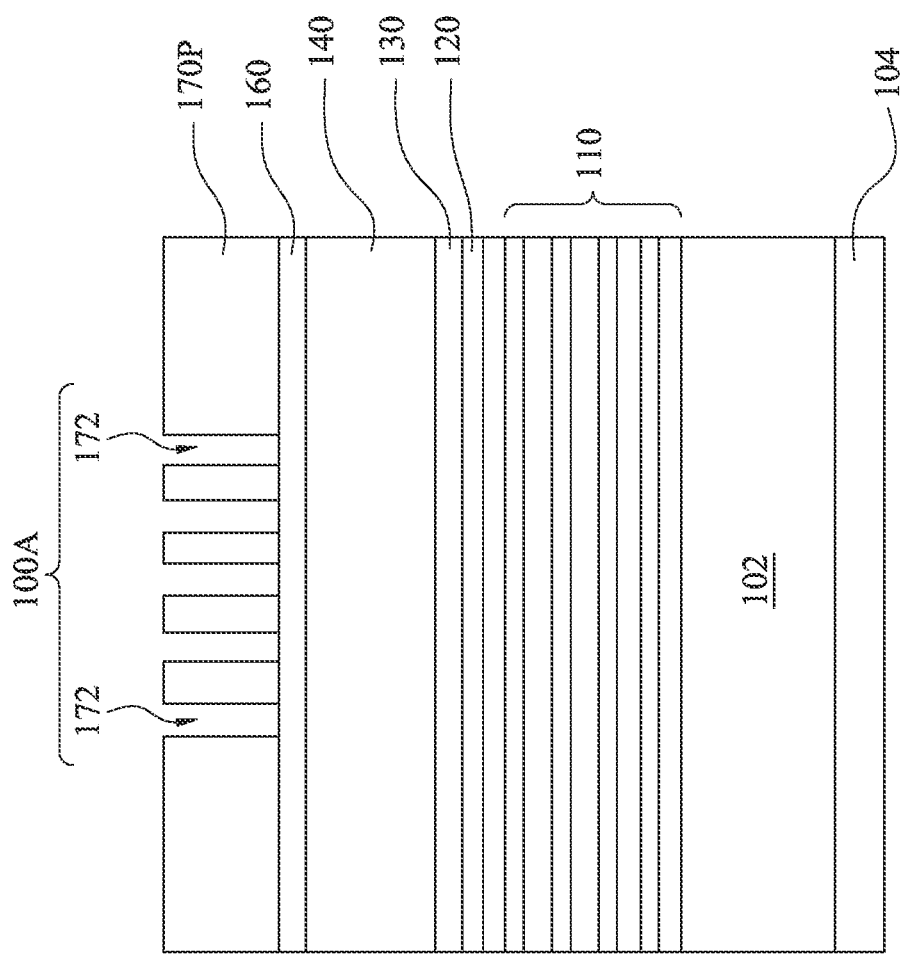

Referring to FIGS. 2 and 3F, the method 200 proceeds to operation 212, in which the photoresist layer 170 is lithographically patterned to form a patterned photoresist layer 170P, in accordance with some embodiments. FIG. 3F is a cross-sectional view of the structure of FIG. 3E after lithographically patterning the photoresist layer 170 to form the patterned photoresist layer 170P, in accordance with some embodiments.

Referring to FIG. 3F, the photoresist layer 170 is patterned by first subjecting the photoresist layer 170 to a pattern of irradiation. Next, the exposed or unexposed portions of the photoresist layer 170 are removed depending on whether a positive-tone or negative-tone resist is used in the photoresist layer 170 with a resist developer, thereby forming the patterned photoresist layer 170P having a pattern of openings 172 formed therein. The openings 172 expose portions of the hard mask layer 160. The openings 172 are located in the pattern region 100A and correspond to locations where the pattern of openings 152 are present in the EUV mask 100 (FIG. 1).

Figure 3G:
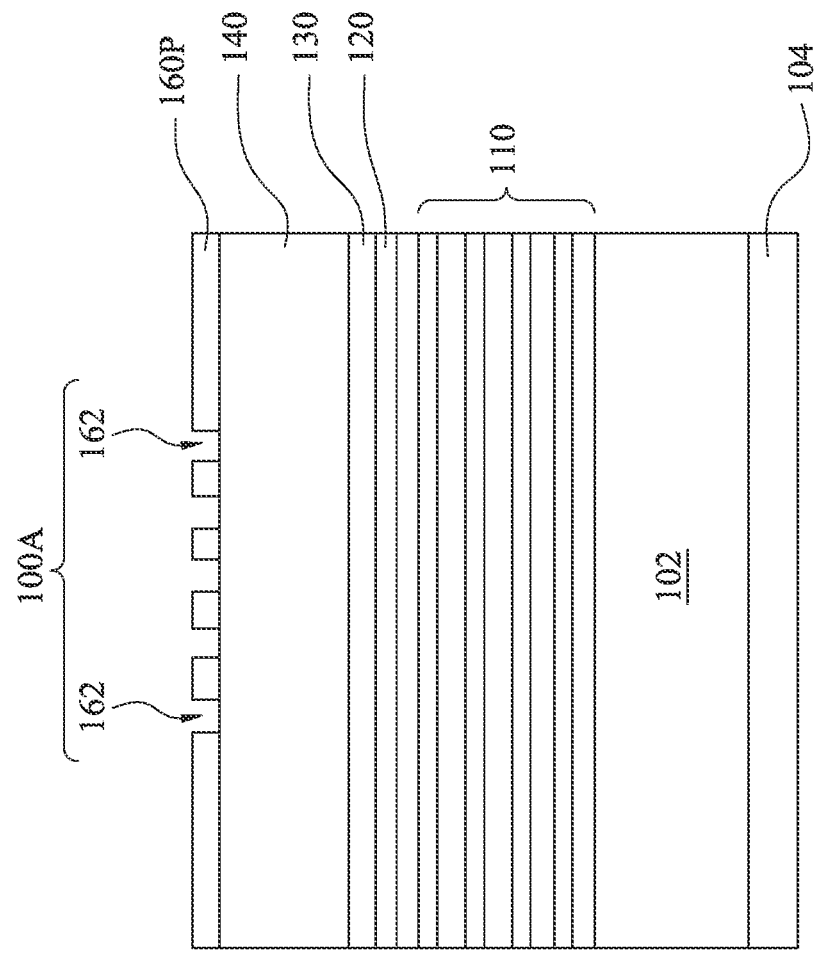

Referring to FIGS. 2 and 3G, the method 200 proceeds to operation 214, in which the hard mask layer 160 is etched using the patterned photoresist layer 170P as an etch mask to form a patterned hard mask layer 160P, in accordance with some embodiments. FIG. 3G is a cross-sectional view of the structure of FIG. 3F after etching the hard mask layer 160 to form the patterned hard mask layer 160P, in accordance with some embodiments.

Referring to FIG. 3G, portions of the hard mask layer 160 that are exposed by the openings 172 are etched to form openings 162 extending through the hard mask layer 160. The openings 162 expose portions of the underlying absorber layer 140. In some embodiments, the hard mask layer 160 is etched using an anisotropic etch. In some embodiments, the anisotropic etch is a dry etch such as, for example, reactive ion etch (RIE), a wet etch, or a combination thereof. The etch removes the material providing the hard mask layer 160 selective to the material providing the absorber layer 140. The remaining portions of the hard mask layer 160 constitute the patterned hard mask layer 160P. If not completely consumed during the etching of the hard mask layer 160, after etching the hard mask layer 160, the patterned photoresist layer 170P is removed from the surfaces of the patterned hard mask layer 160P, for example, using wet stripping or plasma ashing.

Figure 3H:
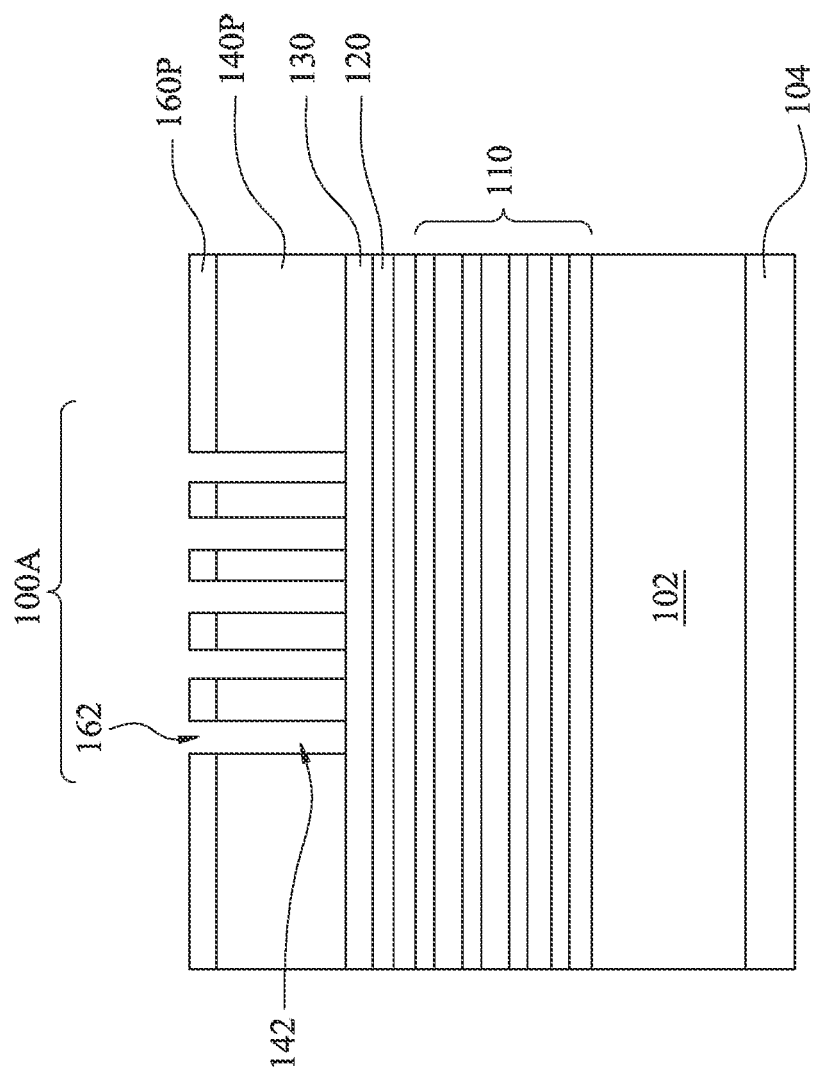

Referring to FIGS. 2 and 3H, the method 200 proceeds to operation 216, in which the absorber layer 140 is etched using the patterned hard mask layer 160P as an etch mask to form a patterned absorber layer 140P, in accordance with some embodiments. FIG. 3H is a cross-sectional view of the structure of FIG. 3G after etching the absorber layer 140 to form the patterned absorber layer 140P, in accordance with some embodiments.

Referring to FIG. 3H, portions of the absorber layer 140 that are exposed by the openings 162 are etched to form openings 142 extending through the absorber layer 140. The openings 142 expose portions of the underlying buffer layer 130. In some embodiments, the absorber layer 140 is etched using an anisotropic etching process. In some embodiments, the anisotropic etch is a dry etch such as, for example, RIE, a wet etch, or a combination thereof that removes the material providing the absorber layer 140 selective to the material providing the underlying buffer layer 130. For example, in some embodiments, the absorber layer 140 is dry etched with a gas that contains chlorine, such as $Cl_2$ or $BCl_3$, or with a gas that contains fluorine, such as $NF_3$. Ar may be used as a carrier gas. In some embodiments, oxygen ($O_2$) may also be included as the carrier gas. The etch rate and the etch selectivity depend on the etchant gas, etchant flow rate, power, pressure, and substrate temperature. After etching, the remaining portions of the absorber layer 140 constitute the patterned absorber layer 140P. In accordance with embodiments of the present disclosure, when absorber layer 140 includes multiple layers of absorber material as described below in more detail, when the individual layers of absorber material have differential etching properties, the individual layers of absorber material may be etched individually using different etchants. When the individual layers of absorber material do not have differential etching properties, the individual layers of absorber for material may be etched simultaneously.

Figure 3I:
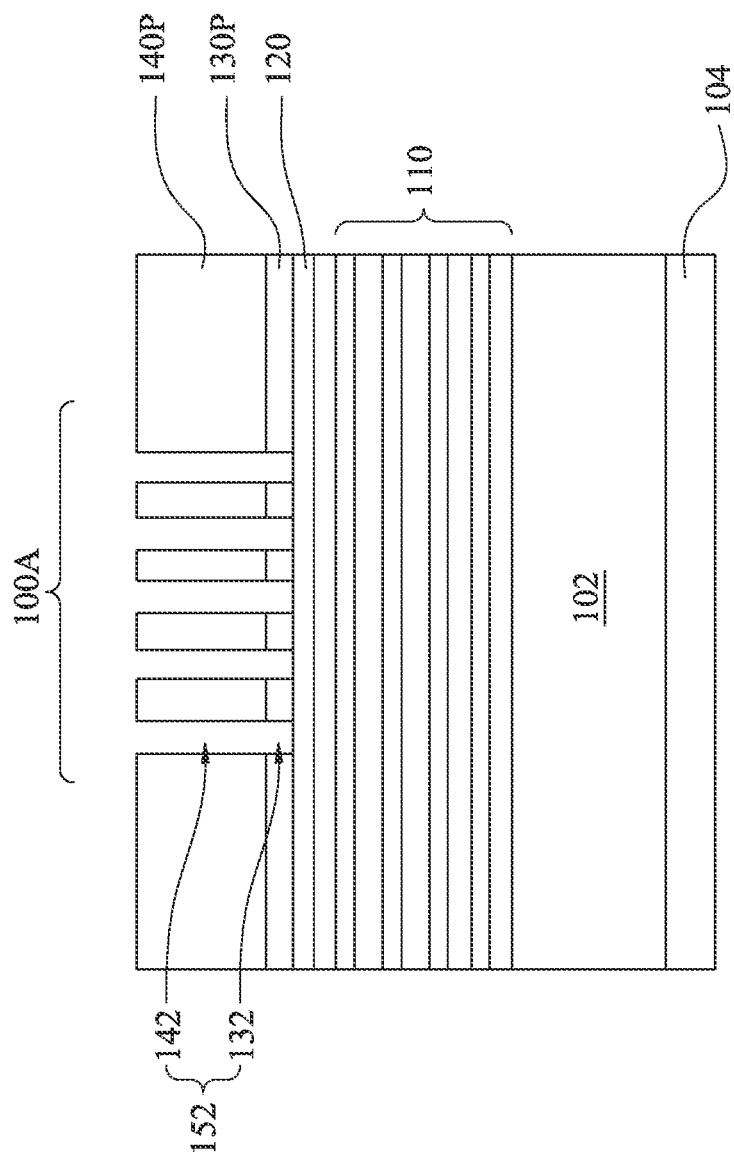

Referring to FIGS. 2 and 3I, the method 200 proceeds to operation 218, in which the buffer layer 130 is etched using the patterned hard mask layer 160P as an etch mask to form a patterned buffer layer 130P, in accordance with some embodiments. FIG. 3I is a cross-sectional view of the structure of FIG. 3H after etching the buffer layer 130 to form the patterned buffer layer 130P, in accordance with some embodiments.

Referring to FIG. 3I, portions of the buffer layer 130 that are exposed by the openings 162 and 142 are etched to form openings 132 extending through the buffer layer 130. The openings 132 expose portions of the underlying capping layer 120. In some embodiments, the buffer layer 130 is etched using an anisotropic etching process. In some embodiments, the anisotropic etch is a dry etch such as, for example, RIE, a wet etch, or a combination thereof that removes the material providing the buffer layer 130 selective to the material providing the capping layer 120. The remaining portions of the buffer layer 130 constitute the patterned buffer layer 130P. After etching the buffer layer 130, the patterned hard mask layer 160P is removed from the surfaces of the patterned absorber layer 140P, for example, using oxygen plasma or a wet etch.

The openings 142 in the patterned absorber layer 140P and respective underlying openings 132 in the patterned buffer layer 130P together define the pattern of openings 152 in the EUV mask 100.

Figure 3J:
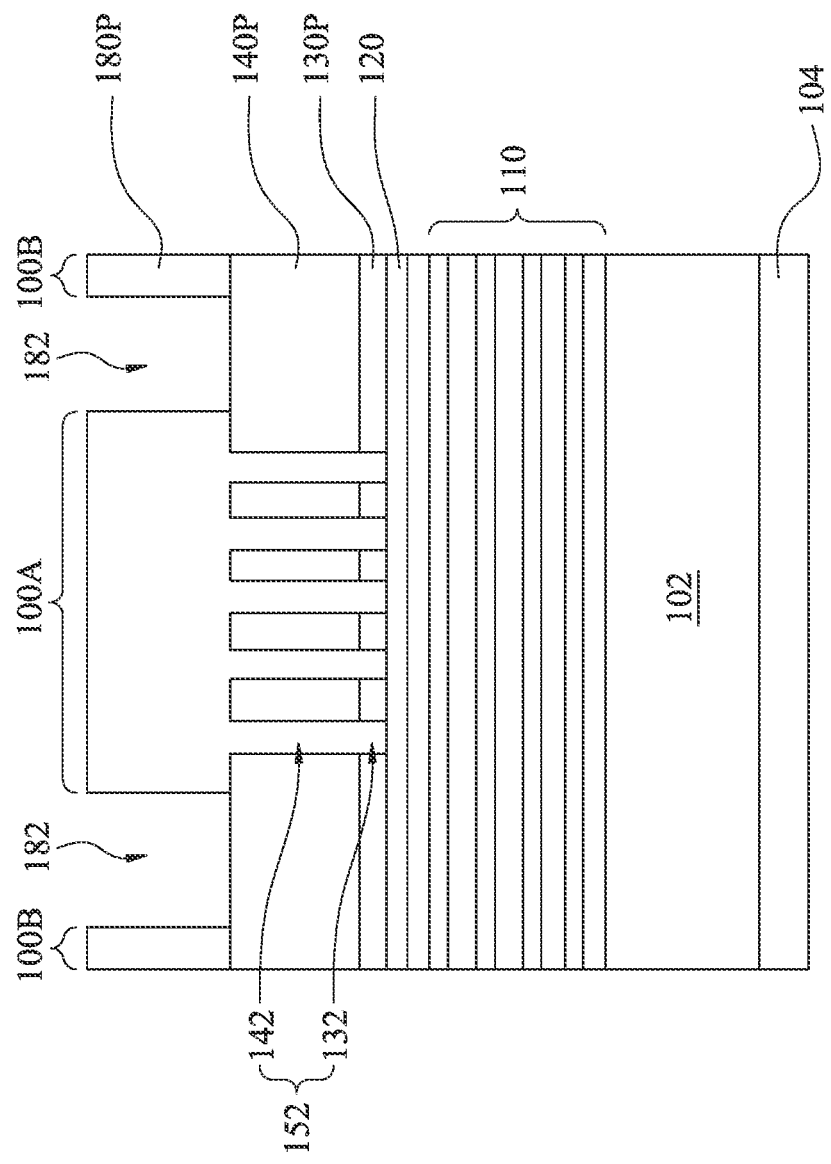

Referring to FIGS. 2 and 3J, the method 200 proceeds to operation 220, in which a patterned photoresist layer 180P comprising a pattern of openings 182 is formed over the patterned absorber layer 140P and the patterned buffer layer 130P, in accordance with some embodiments. FIG. 3J is a cross-sectional view of the structure of FIG. 3I after forming the patterned photoresist layer 180P comprising openings 182 over the patterned absorber layer 140P and the patterned buffer layer 130P, in accordance with some embodiments.

Referring to FIG. 3J, the openings 182 expose portions of the patterned absorber layer 140P at the periphery of the patterned absorber layer 140P. The openings 182 correspond to the trenches 154 in the peripheral region 100B of the EUV mask 100 that are to be formed. To form the patterned photoresist layer 180P, a photoresist layer (not shown) is applied over the patterned buffer layer 130P and the patterned absorber layer 140P. The photoresist layer fills the openings 132 and 142 in the patterned buffer layer 130P and the patterned absorber layer 140P, respectively. In some embodiments, the photoresist layer includes a positive-tone photoresist material, a negative-tone photoresist material, or a hybrid-tone photoresist material. In some embodiments, the photoresist layer includes a same material as the photoresist layer 170 described above in FIG. 3E. In some embodiments, the photoresist layer includes a different material from the photoresist layer 170. In some embodiments, the photoresist layer is formed, for example, by spin coating. The photoresist layer 170 is subsequently patterned by exposing the photoresist layer to a pattern of radiation, and removing the exposed or unexposed portions of the photoresist layer using a resist developer depending on whether a positive or negative resist is used. The remaining portions of the photoresist layer constitute the patterned photoresist layer 180P.

Figure 3K:
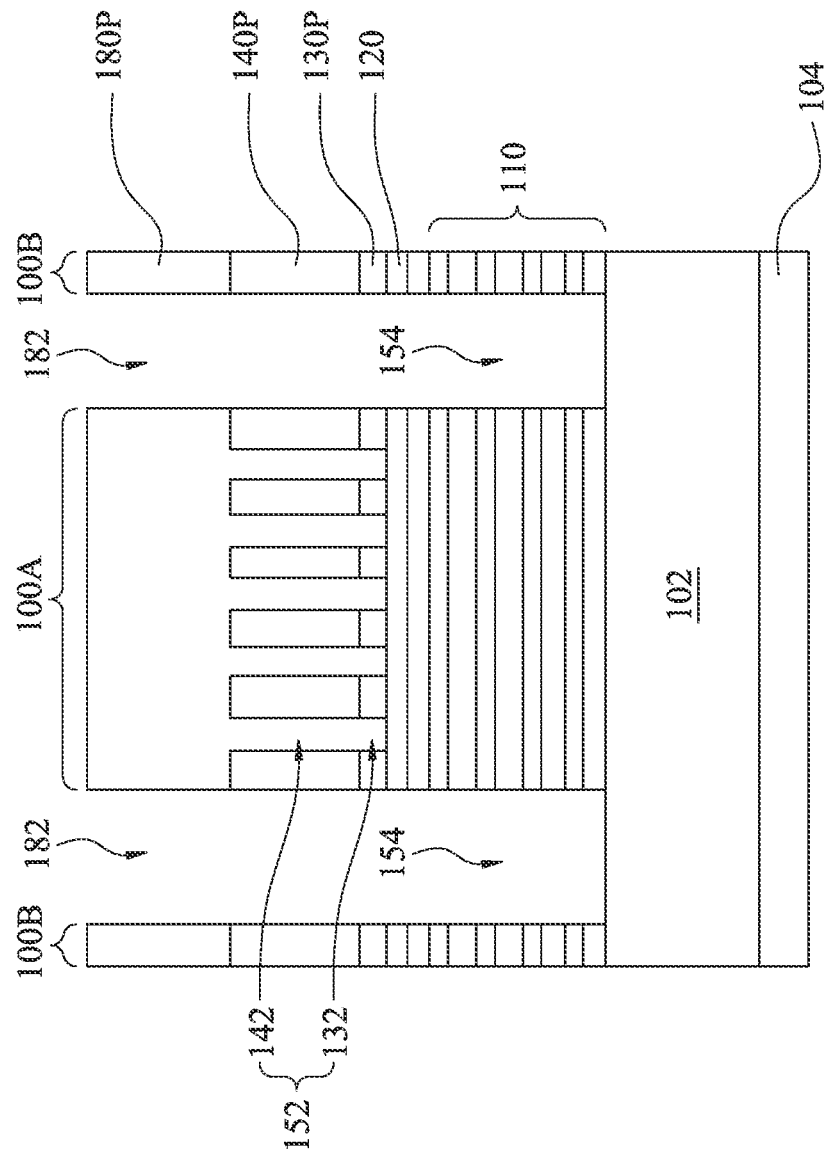

Referring to FIGS. 2 and 3K, the method 200 proceeds to operation 222, in which the patterned absorber layer 140P, the patterned buffer layer 130P if present, the capping layer 120, and the reflective multilayer stack 110 are etched using the patterned photoresist layer 180P as an etch mask to form trenches 154 in the peripheral region 100B of the substrate 102, in accordance with some embodiments. FIG. 3K is a cross-sectional view of the structure of FIG. 3J after etching the patterned absorber layer 140P, the patterned buffer layer 130P if present, the capping layer 120, and the reflective multilayer stack 110, to form the trenches 154 in the peripheral region 100B of the substrate 102, in accordance with some embodiments.

Referring to FIG. 3K, the trenches 154 extend through the patterned absorber layer 140P, the patterned buffer layer 130P if present, the capping layer 120, and the reflective multilayer stack 110 to expose the surface of the substrate 102. The trenches 154 surround the pattern region 100A of the EUV mask 100, separating the pattern region 100A from the peripheral region 100B.

In some embodiments, the patterned absorber layer 140P, the patterned buffer layer 130P, the capping layer 120, and the reflective multilayer stack 110 are etched using a single anisotropic etching process. The anisotropic etch can be a dry etch such as, for example, RIE, a wet etch, or a combination thereof that removes materials of the respective patterned absorber layer 140P, the patterned buffer layer 130P, the capping layer 120, and the reflective multilayer stack 110, selective to the material providing the substrate 102. In some embodiments, the patterned absorber layer 140P, the patterned buffer layer 130P, the capping layer 120, and the reflective multilayer stack 110 are etched using multiple distinct anisotropic etching processes. Each anisotropic etch can be a dry etch such as, for example, RIE, a wet etch, or a combination thereof.

Figure 3L:
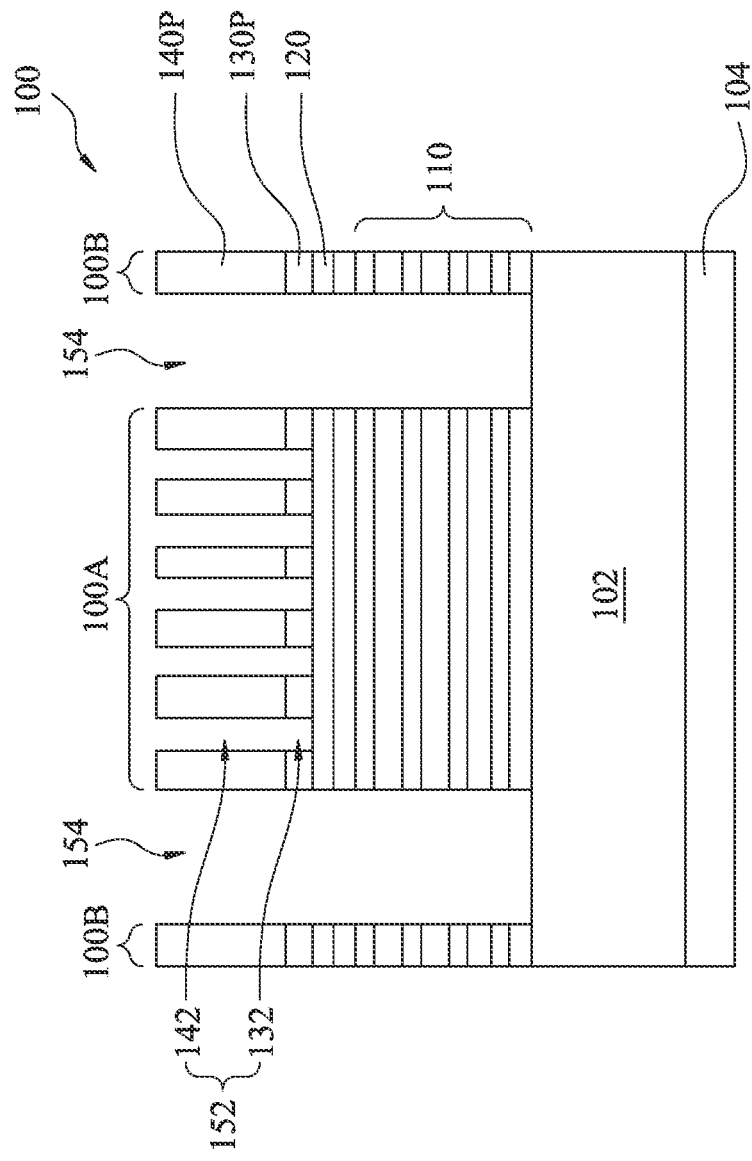

Referring to FIGS. 2 and 3L, the method 200 proceeds to operation 224, in which the patterned photoresist layer 180P is removed, in accordance with some embodiments. FIG. 3L is a cross-sectional view of the structure of FIG. 3K after removing the patterned photoresist layer 180P, in accordance with some embodiments.

Referring to FIG. 3L, the patterned photoresist layer 180P is removed from the pattern region 100A and the peripheral region 100B of the substrate 102, for example, by wet stripping or plasma ashing. The removal of the patterned photoresist layer 180P from the openings 142 in the patterned absorber layer 140P and the openings 132 in the patterned buffer layer 130P re-exposes the surfaces of the capping layer 120 in the pattern region 100A.

An EUV mask 100 is thus formed. The EUV mask 100 includes a substrate 102, a reflective multilayer stack 110 over a front surface of the substrate 102, a capping layer 120 over the reflective multilayer stack 110, a patterned buffer layer 130P over the capping layer 120, and a patterned absorber layer 140P over the patterned buffer layer 130P. The EUV mask 100 further includes a conductive layer 104 over a back surface of the substrate 102 opposite the front surface. The patterned absorber layer 140P includes an alloy having a high extinction coefficient, which allows forming a thinner layer. The mask 3D effects caused by the thicker absorber layer can thus be reduced and unnecessary EUV light can be eliminated. As a result, a pattern on the EUV mask 100 can be projected precisely onto a silicon wafer.

After removal of the patterned photoresist layer 180P, the EUV mask 100 is cleaned to remove any contaminants therefrom. In some embodiments, the EUV mask 100 is cleaned by submerging the EUV mask 100 into an ammonium hydroxide ($NH_4OH$) solution. In some embodiments, the EUV mask 100 is cleaned by submerging the EUV mask 100 into a diluted hydrofluoric acid (HF) solution.

The EUV mask 100 is subsequently radiated with, for example, an UV light with a wavelength of 193 nm, for inspection of any defects in the patterned region 100A. The foreign matters may be detected from diffusely reflected light. If defects are detected, the EUV mask 100 is further cleaned using suitable cleaning processes.

Figure 4:
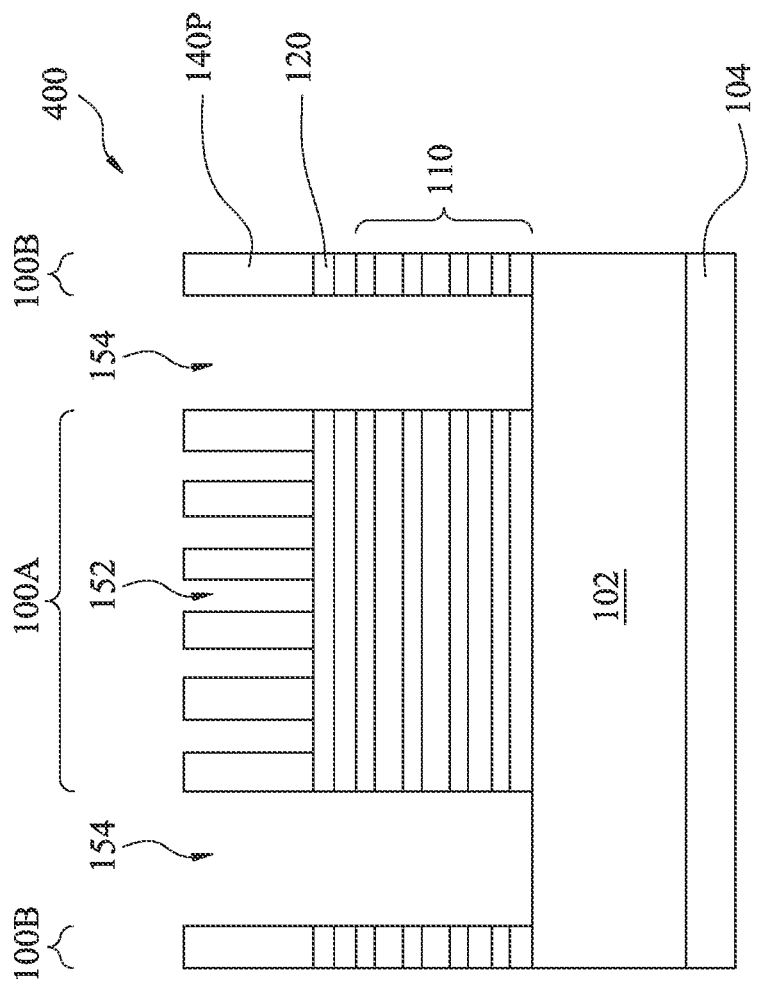
FIG. 4 is a cross-sectional view of an extreme ultraviolet (EUV) mask, in accordance with a second embodiment.

FIG. 4 is a cross-sectional view of an EUV mask 400, in accordance with a second embodiment of the present disclosure. Referring to FIG. 4, the EUV mask 400 includes a substrate 102, a reflective multilayer stack 110 over a front surface of the substrate 102, a capping layer 120 over the reflective multilayer stack 110, and a patterned absorber layer 140P over the capping layer 120. The EUV mask 400 further includes a conductive layer 104 over a back surface of the substrate 102 opposite the front surface. In comparison with the EUV mask 400 of FIG. 1, the patterned buffer layer 130P is omitted in the EUV mask 400. Accordingly, in the EUV mask 100, the patterned absorber layer 140P is in direct contact with the capping layer 120.

Figure 5:
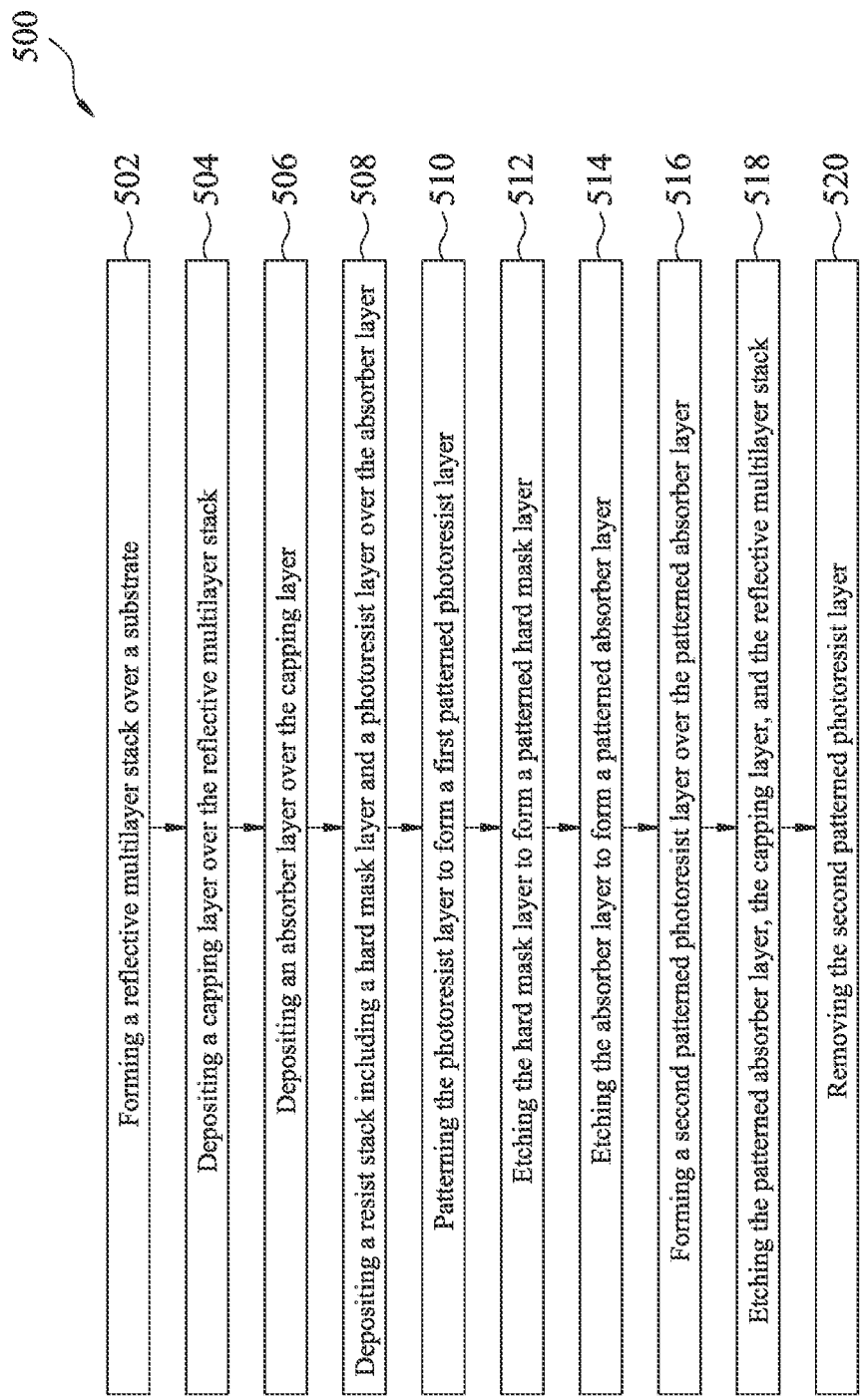
FIG. 5 is a flowchart of a method for fabricating the EUV mask of FIG. 4, in accordance with some embodiments.

FIG. 5 is a flowchart of a method 500 for fabricating an EUV mask, for example, EUV mask 400, in accordance with some embodiments. FIG. 6A through FIG. 6J are cross-sectional views of the EUV mask 400 at various stages of the fabrication process, in accordance with some embodiments. The method 500 is discussed in detail below, with reference to the EUV mask 400. In some embodiments, additional operations are performed before, during, and/or after the method 500, or some of the operations described are replaced and/or eliminated. In some embodiments, some of the features described below are replaced or eliminated. One of ordinary skill in the art would understand that although some embodiments are discussed with operations performed in a particular order, these operations may be performed in another logical order.

Figure 6A:
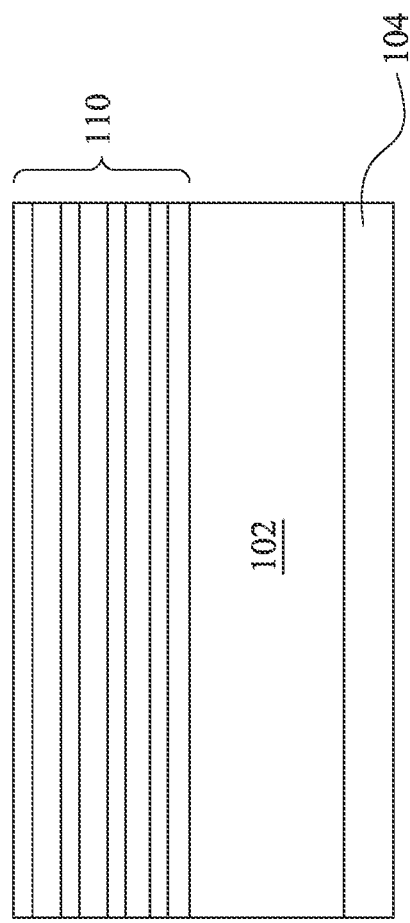

Referring to FIGS. 5 and 6A, the method 500 includes operation 502, in which a reflective multilayer stack 110 is formed over a substrate 102, in accordance with some embodiments. FIG. 6A is a cross-sectional view of an initial structure of an EUV mask 400 after forming the reflective multilayer stack 110 over the substrate 102, in accordance with some embodiments. The materials and formation processes for the reflective multilayer stack 110 are similar to those described above in FIG. 3A, and hence are not described in detail herein.

Figure 6B:
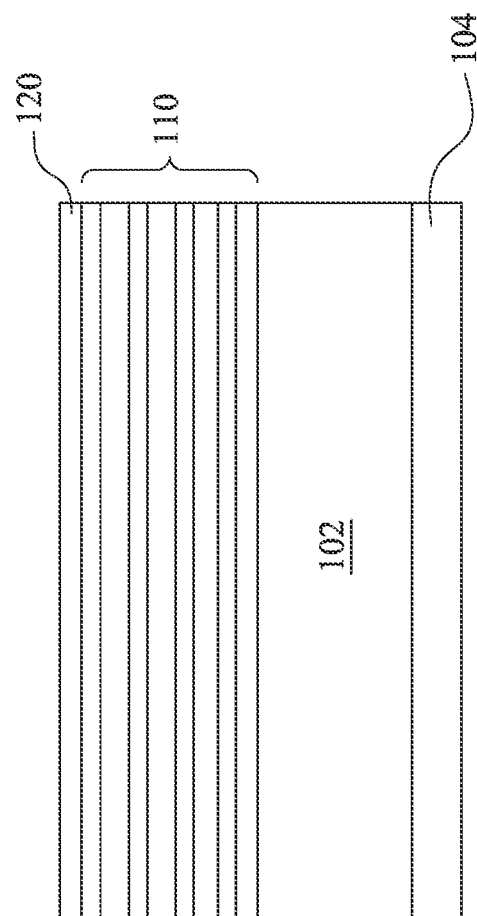

Referring to FIGS. 5 and 6B, the method 500 proceeds to operation 504, in which a capping layer 120 is deposited over the reflective multilayer stack 110, in accordance with some embodiments. FIG. 6B is a cross-sectional view of the structure of FIG. 6A after depositing the capping layer 120 over the reflective multilayer stack 110, in accordance with some embodiments. The materials and formation processes for the capping layer 120 are similar to those described above in FIG. 3B, and hence are not described in detail herein.

Figure 6C:
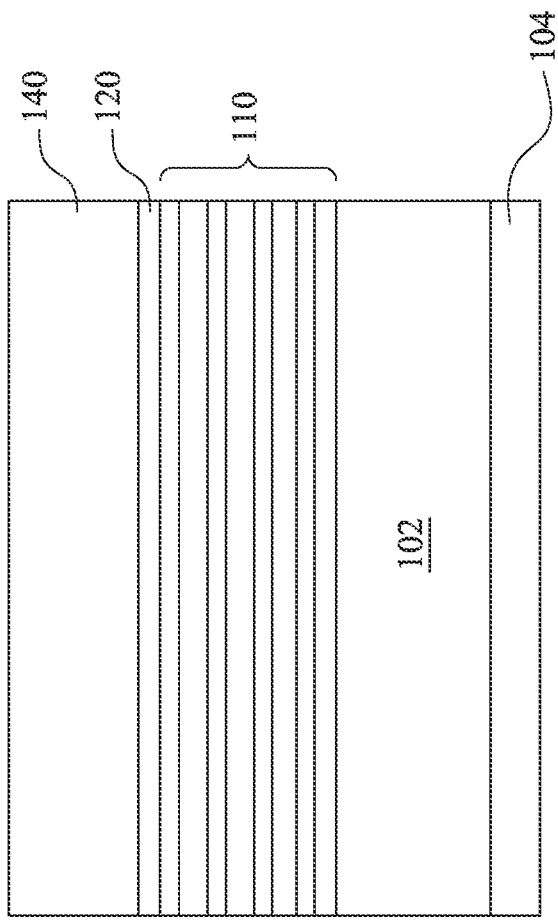

Referring to FIGS. 5 and 6C, the method 500 proceeds to operation 506, in which an absorber layer 140 is deposited over the capping layer 120, in accordance with various embodiments. FIG. 6C is a cross-sectional view of the structure of FIG. 6B after depositing the absorber layer 140 over the capping layer 120, in accordance with some embodiments. The materials and formation processes for the absorber layer 140 are similar to those described above in FIG. 3D, and hence are not described in detail herein.

Figure 6D:
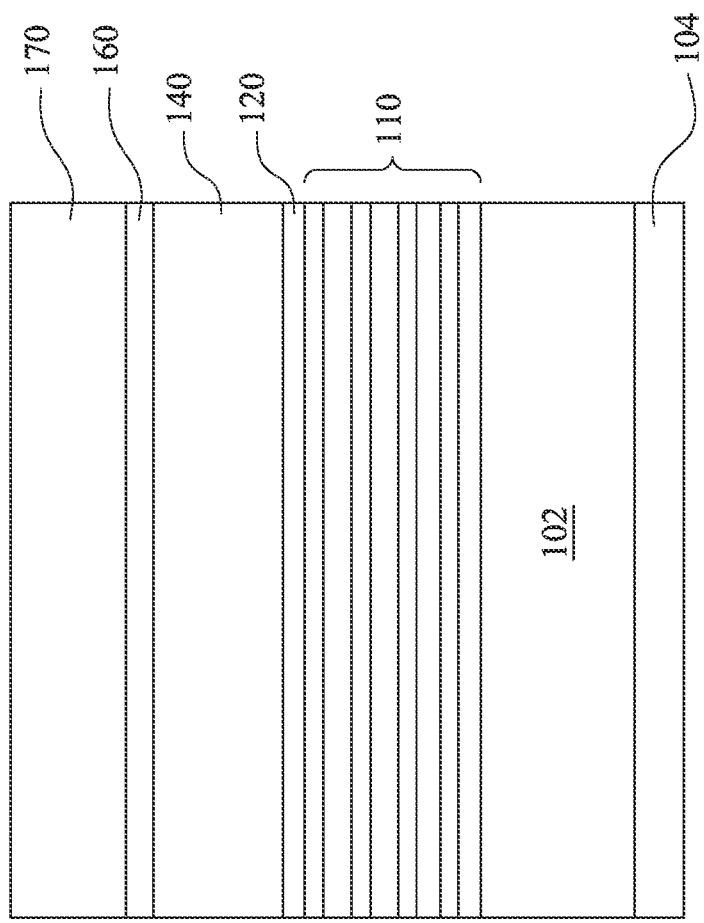

Referring to FIGS. 5 and 6D, the method 500 proceeds to operation 508, in which a resist stack including a hard mask layer 160 and a photoresist layer 170 is deposited over the absorber layer 140, in accordance with some embodiments. FIG. 6D is a cross-sectional view of the structure of FIG. 6C after sequentially depositing the hard mask layer 160 and the photoresist layer 170 over the absorber layer 140, in accordance with some embodiments. Materials and formation processes for respective hard mask layer 160 and photoresist layer 170 are similar to those described in FIG. 3E, and hence are not described in detail herein.

Figure 6E:
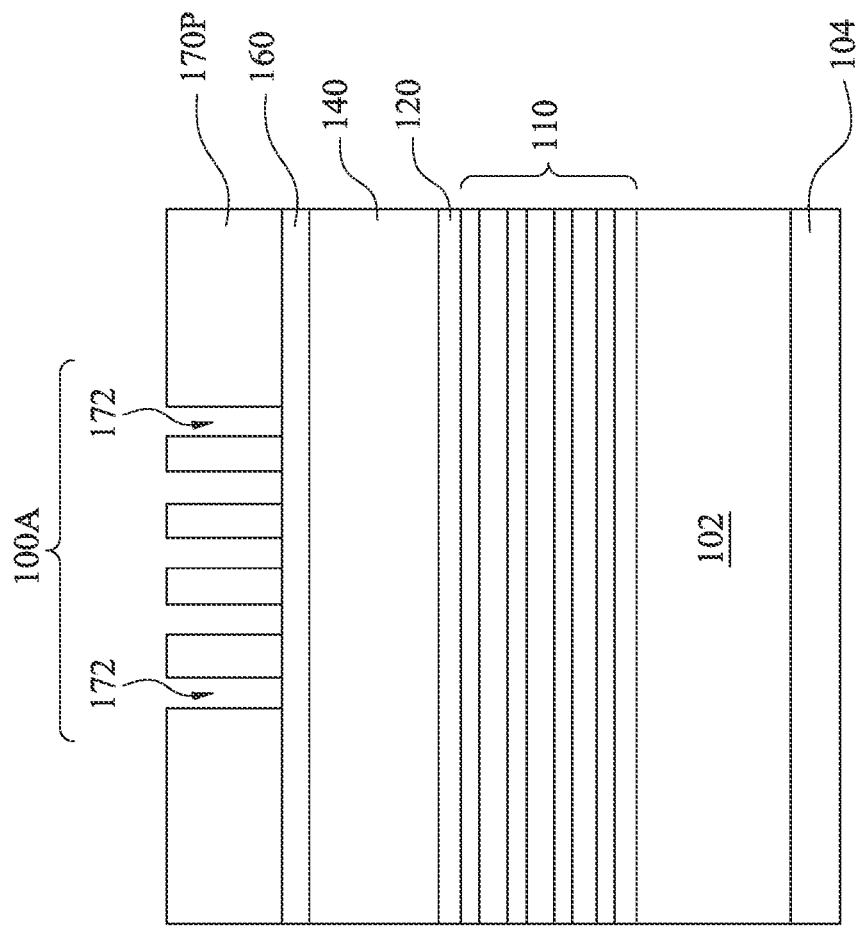

Referring to FIGS. 5 and 6E, the method 500 proceeds to operation 510, in which the photoresist layer 170 is lithographically patterned to form a patterned photoresist layer 170P, in accordance with some embodiments. FIG. 6E is a cross-sectional view of the structure of FIG. 6D after lithographically patterning the photoresist layer 170 to form the patterned photoresist layer 170P, in accordance with some embodiments. Etching processes for the photoresist layer 170 are similar to those described in FIG. 3F, and hence are not described in detail herein.

Referring to FIGS. 5 and 6F, the method 500 proceeds to operation 512, in which the hard mask layer 160 is etched using the patterned photoresist layer 170P as an etch mask to form a patterned hard mask layer 160P, in accordance with some embodiments. FIG. 6F is a cross-sectional view of the structure of FIG. 6E after etching the hard mask layer 160 to form the patterned hard mask layer 160P, in accordance with some embodiments. Etching processes for the hard mask layer 160 are similar to those described in FIG. 3G, and hence are not described in detail herein.

Referring to FIGS. 5 and 6G, the method 500 proceeds to operation 514, in which the absorber layer 140 is etched using the patterned hard mask layer 160P as an etch mask to form a patterned absorber layer 140P, in accordance with some embodiments. FIG. 6G is a cross-sectional view of the structure of FIG. 6F after etching the absorber layer 140 to form the patterned absorber layer 140P, in accordance with some embodiments. Etching processes for the absorber layer 140 are similar to those described in FIG. 3H, and hence are not described in detail herein. The patterned absorber layer 140P includes a plurality of openings 142 that expose the underlying capping layer 120.

After etching the absorber layer 140, the patterned hard mask layer 160P is removed from the surfaces of the patterned absorber layer 140P, for example, using oxygen plasma or a wet etch.

Figure 6H:
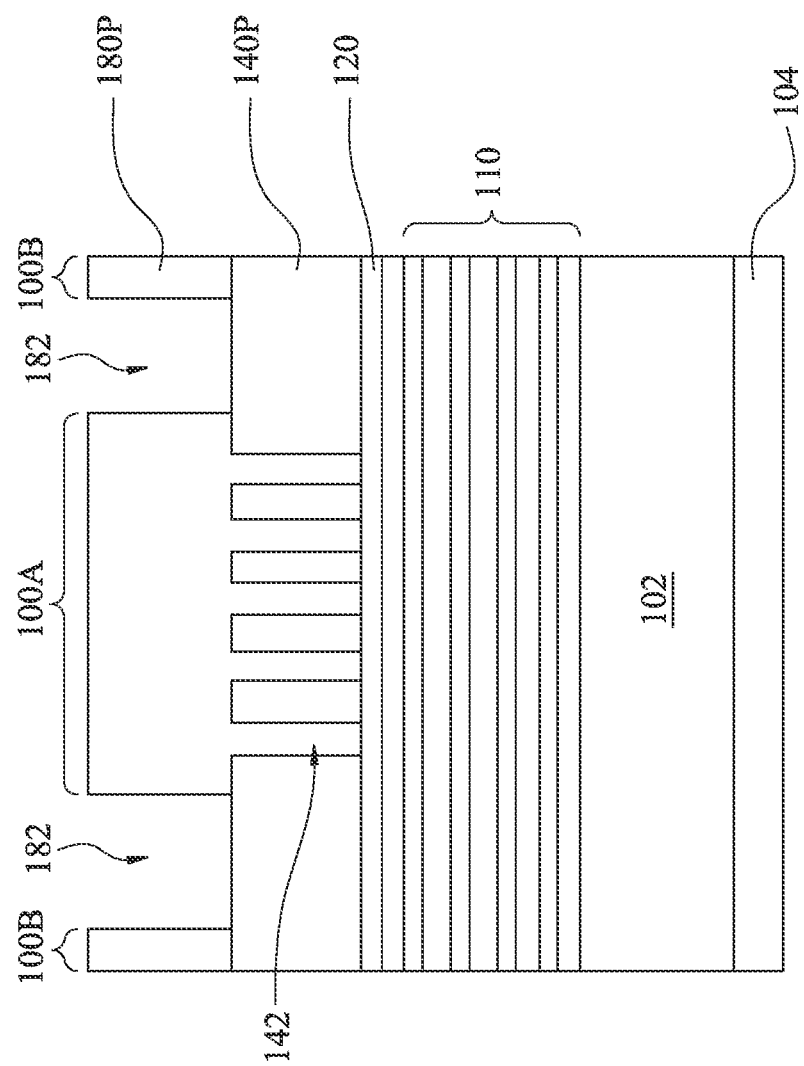

Referring to FIGS. 5 and 6H, the method 500 proceeds to operation 516, in which a patterned photoresist layer 180P comprising a pattern of openings 182 is formed over the patterned absorber layer 140P, in accordance with some embodiments. FIG. 6H is a cross-sectional view of the structure of FIG. 6G after forming the patterned photoresist layer 180P comprising openings 182 over the patterned absorber layer 140P, in accordance with some embodiments. Materials and fabrication processes for the patterned photoresist layer 180P are similar to those described in FIG. 3J, and hence are not described in detail herein.

Figure 6I:
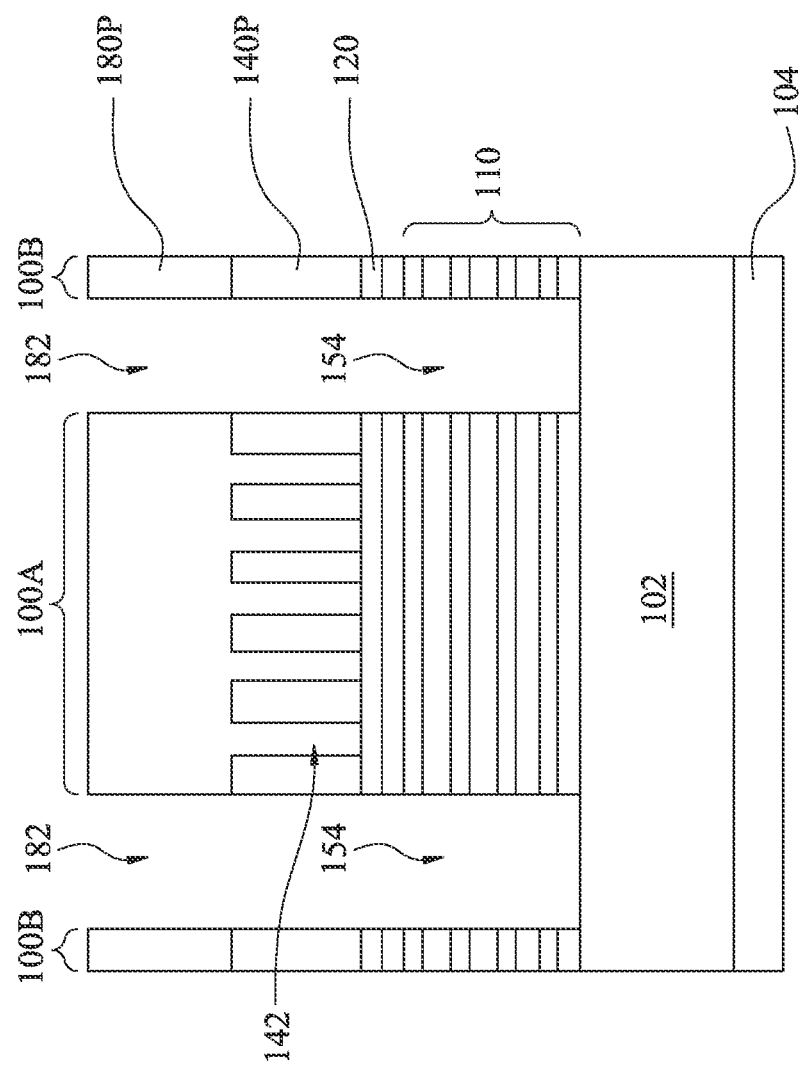

Referring to FIGS. 5 and 6I, the method 500 proceeds to operation 518, in which the patterned absorber layer 140P, the capping layer 120, and the reflective multilayer stack 110 are etched using the patterned photoresist layer 180P as an etch mask to form trenches 154 in the peripheral region 100B of the substrate 102, in accordance with some embodiments. FIG. 6I is a cross-sectional view of the structure of FIG. 6H after etching the patterned absorber layer 140P, the capping layer 120, and the reflective multilayer stack 110, to form the trenches 154 in the peripheral region 100B of the substrate 102, in accordance with some embodiments.

Referring to FIG. 6I, the trenches 154 extend through the patterned absorber layer 140P, the capping layer 120, and the reflective multilayer stack 110 to expose the surface of the substrate 102. The trenches 154 surround the pattern region 100A of the EUV mask 100, separating the pattern region 100A from the peripheral region 100B.

In some embodiments, the patterned absorber layer 140P, the capping layer 120, and the reflective multilayer stack 110 are etched using a single anisotropic etching process. The anisotropic etch can be a dry etch such as, for example, RIE, a wet etch, or a combination thereof that removes materials of the respective patterned absorber layer 140P, the capping layer 120, and the reflective multilayer stack 110, selective to the material providing the substrate 102. In some embodiments, the patterned absorber layer 140P, the capping layer 120, and the reflective multilayer stack 110 are etched using multiple distinct anisotropic etching processes. Each anisotropic etch can be a dry etch such as, for example, RIE, a wet etch, or a combination thereof.

Figure 6J:
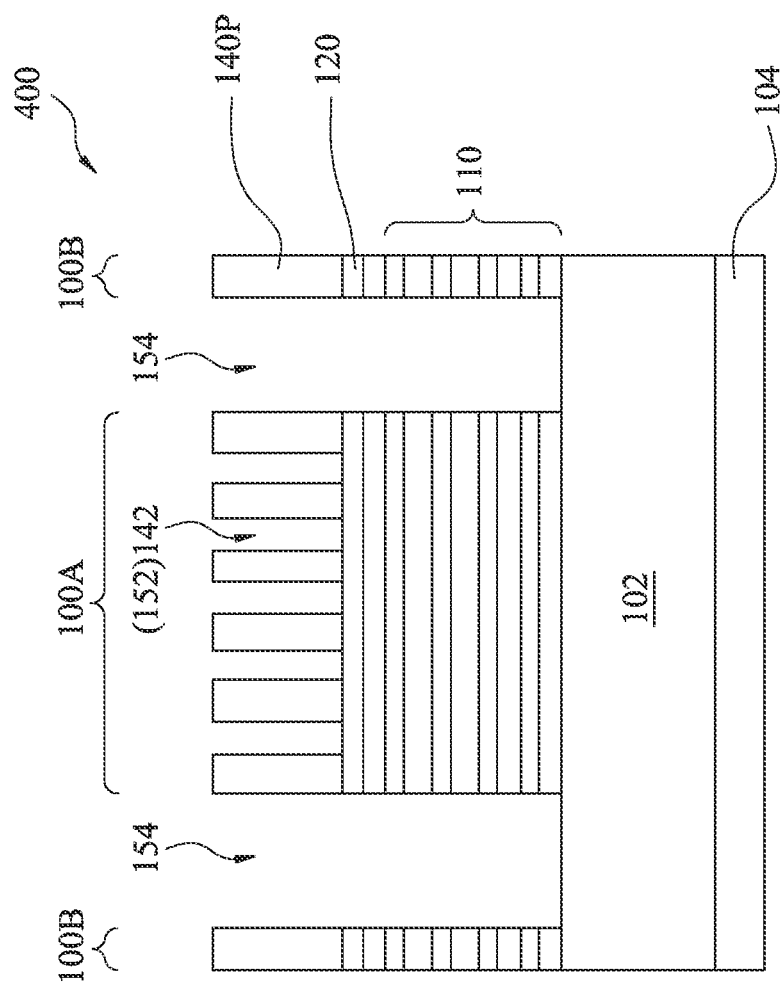

Referring to FIGS. 5 and 6J, the method 500 proceeds to operation 520, in which the patterned photoresist layer 180P is removed, in accordance with some embodiments. FIG. 6J is a cross-sectional view of the structure of FIG. 6I after removing the patterned photoresist layer 180P, in accordance with some embodiments.

Referring to FIG. 6J, the patterned photoresist layer 180P is removed from the pattern region 100A and the peripheral region 100B of the substrate 102, for example, by wet stripping or plasma ashing. The removal of the patterned photoresist layer 180P from the openings 142 in the patterned absorber layer 140P re-exposes the surfaces of the capping layer 120 in the pattern region 100A. The openings 142 in the patterned absorber layer 140P define the pattern of openings 152 in the EUV mask 400.

An EUV mask 400 is thus formed. The EUV mask 400 includes a substrate 102, a reflective multilayer stack 110 over a front surface of the substrate 102, a capping layer 120 over the reflective multilayer stack 110, and a patterned absorber layer 140P over the capping layer 120. The EUV mask 400 further includes a conductive layer 104 over a back surface of the substrate 102 opposite the front surface. The patterned absorber layer 140P includes an alloy having a high extinction coefficient, which allows forming a thinner layer. The mask 3D effects caused by the thicker absorber layer can thus be reduced and unnecessary EUV light can be eliminated. As a result, a pattern on the EUV mask 400 can be projected precisely onto a silicon wafer.

After removal of the patterned photoresist layer 180P, the EUV mask 400 is cleaned to remove any contaminants therefrom. In some embodiments, the EUV mask 400 is cleaned by submerging the EUV mask 400 into an ammonium hydroxide ($NH_4OH$) solution. In some embodiments, the EUV mask 400 is cleaned by submerging the EUV mask 400 into a diluted hydrofluoric acid (HF) solution.

The EUV mask 400 is subsequently radiated with, for example, an UV light with a wavelength of 193 nm, for inspection of any defects in the patterned region 100A. The foreign matters may be detected from diffusely reflected light. If defects are detected, the EUV mask 400 is further cleaned using suitable cleaning processes.

Figure 11:
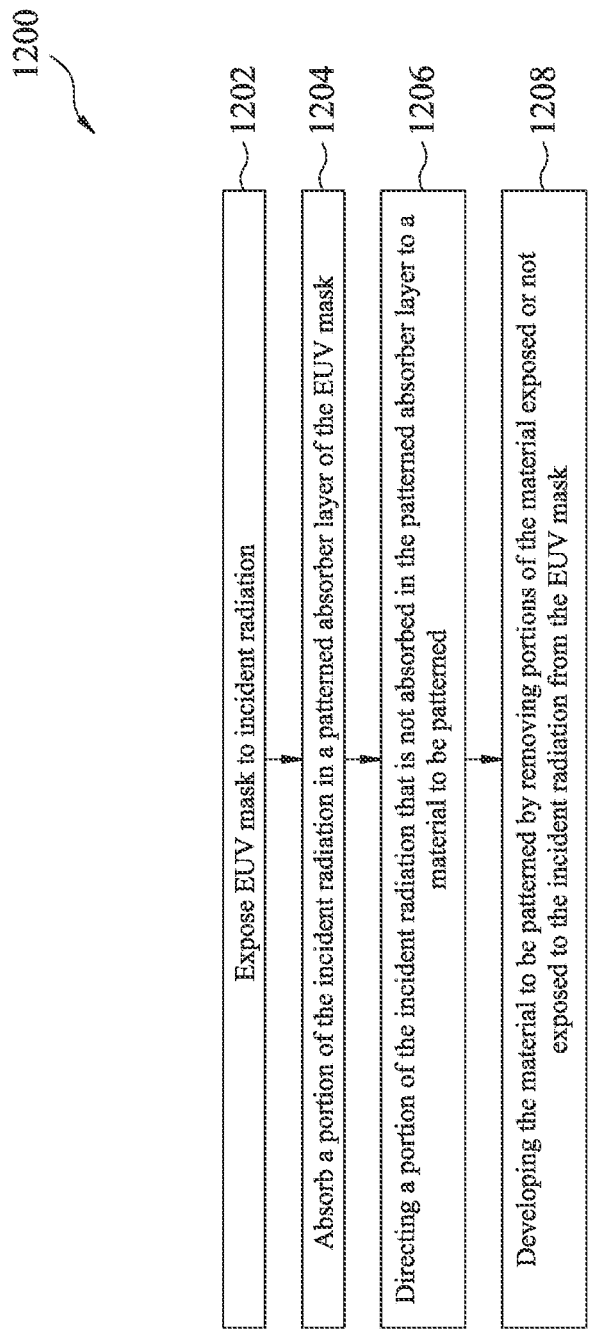
FIG. 11 is a flowchart of a method of using an EUV mask in accordance with some embodiments.

FIG. 11 illustrates a method 1200 of using an EUV mask in accordance with embodiments of the present disclosure. Method 1200 includes step 1202 of exposing an EUV mask to an incident radiation. An example of an EUV mask useful in step 1202 include the EUV masks described above. At step 1204, a portion of the incident radiation is absorbed in a patterned absorber layer of the EUV mask. A portion of the incident radiation that is not absorbed in the patterned absorber layer is directed to a material to be patterned in step 1206. After the material to be patterned has been exposed to the incident radiation from the EUV mask, in step 1208 portions of the material exposed or not exposed to the incident radiation from the EUV mask are removed.

One aspect of this description relates to an EUV mask. The EUV mask includes a substrate, a reflective multilayer stack on the substrate, and a patterned absorber layer on the reflective multilayer stack. The patterned absorber layer includes a first layer of absorber material and a second layer of absorber material different from the first layer of absorber material, the absorber material of the first layer having an index of refraction smaller than 0.95 and an extinction coefficient greater than 0.01. In some embodiments, the absorber material of the first layer is selected from an alloy comprising ruthenium (Ru), chromium (Cr), tantalum (Ta), platinum (Pt), gold (Au), iridium (Ir), titanium (Ti), niobium (Nb), rhodium (Rh), molybdenum (Mo), tungsten (W), or palladium (Pd), and at least one alloying element selected from ruthenium (Ru), chromium (Cr), tantalum (Ta), platinum (Pt), palladium (Pd), tungsten (W), gold (Au), iridium (Ir), titanium (Ti), niobium (Nb), rhodium (Rh), molybdenum (Mo), hafnium (Hf), boron (B), nitrogen (N), silicon (Si), zirconium (Zr), or vanadium (V).

Another aspect of this description relates to an EUV mask. The EUV mask includes a substrate, a reflective multilayer stack on the substrate, and a patterned absorber layer on the reflective multilayer stack. The patterned absorber layer includes an alloy comprising ruthenium (Ru), chromium (Cr), platinum (Pt), gold (Au), iridium (Ir), titanium (Ti), niobium (Nb), rhodium (Rh), molybdenum (Mo), tungsten (W), or palladium (Pd), and at least one alloying element selected from ruthenium (Ru), chromium (Cr), tantalum (Ta), platinum (Pt), palladium (Pd), tungsten (W), gold (Au), iridium (Ir), titanium (Ti), niobium (Nb), rhodium (Rh), molybdenum (Mo), hafnium (Hf), boron (B), nitrogen (N), silicon (Si), zirconium (Zr), or vanadium (V).

Another aspect of this description relates to relates to a method of forming an EUV mask. The method includes forming a reflective multilayer stack on a substrate, depositing a capping layer on the reflective multilayer stack, depositing a first layer of absorber material on the capping layer, depositing a second layer of absorber material on the first layer absorber material where in the absorber material of the second layer is different from the absorber material of the first layer, forming a hard mask layer on the second layer of absorber material, etching the hard mask layer to form a patterned hard mask layer and etching the first layer of absorber material to form a plurality of openings in the first layer of absorber material. The absorber material of the first layer includes an alloy comprising ruthenium (Ru), chromium (Cr), tantalum (Ta), platinum (Pt), gold (Au), iridium (Ir), titanium (Ti), niobium (Nb), rhodium (Rh), molybdenum (Mo), tungsten (W), or palladium (Pd), and at least one alloying element selected from ruthenium (Ru), chromium (Cr), tantalum (Ta), platinum (Pt), palladium (Pd), tungsten (W), gold (Au), iridium (Ir), titanium (Ti), niobium (Nb), rhodium (Rh), molybdenum (Mo), hafnium (Hf), boron (B), nitrogen (N), silicon (Si), zirconium (Zr), or vanadium (V). The absorber material of the second layer includes an alloy comprising ruthenium (Ru), chromium (Cr), tantalum (Ta), platinum (Pt), gold (Au), iridium (Ir), titanium (Ti), niobium (Nb), rhodium (Rh), molybdenum (Mo), tungsten (W), or palladium (Pd), and at least one alloying element selected from ruthenium (Ru), chromium (Cr), tantalum (Ta), platinum (Pt), gold (Au), iridium (Ir), titanium (Ti), niobium (Nb), rhodium (Rh), molybdenum (Mo), hafnium (Hf), boron (B), nitrogen (N), silicon (Si), zirconium (Zr), or vanadium (V).

Still another aspect of this description relates to a method of forming an EUV mask. The method includes forming a reflective multilayer stack on a substrate. A capping layer is then deposited on the reflective multilayer stack. Next, a buffer layer is formed on the capping layer. A first layer of absorber material is deposited on the buffer layer and a second layer of absorber material is deposited on the first layer of absorber material. The absorber material of the first layer includes an alloy comprising ruthenium (Ru), chromium (Cr), tantalum (Ta), platinum (Pt), gold (Au), iridium (Ir), titanium (Ti), niobium (Nb), rhodium (Rh), molybdenum (Mo), tungsten (W), or palladium (Pd), and at least one alloying element selected from ruthenium (Ru), chromium (Cr), tantalum (Ta), platinum (Pt), palladium (Pd), tungsten (W), gold (Au), iridium (Ir), titanium (Ti), niobium (Nb), rhodium (Rh), molybdenum (Mo), hafnium (Hf), boron (B), nitrogen (N), silicon (Si), zirconium (Zr), or vanadium (V). The absorber material of the second layer includes an alloy comprising ruthenium (Ru), chromium (Cr), tantalum (Ta), platinum (Pt), gold (Au), iridium (Ir), titanium (Ti), niobium (Nb), rhodium (Rh), molybdenum (Mo), tungsten (W), or palladium (Pd), and at least one alloying element selected from ruthenium (Ru), chromium (Cr), tantalum (Ta), platinum (Pt), palladium (Pd), tungsten (W), gold (Au), iridium (Ir), titanium (Ti), niobium (Nb), rhodium (Rh), molybdenum (Mo), hafnium (Hf), boron (B), nitrogen (N), silicon (Si), zirconium (Zr), or vanadium (V). Next, a hard mask layer is formed on the second layer of absorber material. The hard mask layer is then etched to form a patterned hard mask layer. Next, the second layer of absorber material in the first layer of absorber material are etched to form a plurality of openings therein using the patterned hard mask layer as an etch mask.

Another aspect of the present disclosure relates to use of an EUV mask to pattern a material. In accordance with these aspects, an EUV mask is exposed to an incident radiation. The EUV mask includes a substrate (102), a reflective multilayer stack (110) on the substrate and a patterned absorber layer on the reflective multilayer stack. In some aspects, the patterned absorber layer includes an alloy comprising ruthenium (Ru), chromium (Cr), platinum (Pt), gold (Au), iridium (Ir), titanium (Ti), niobium (Nb), rhodium (Rh), molybdenum (Mo), tungsten (W) or palladium (Pd), and at least one alloying element selected from ruthenium (Ru), chromium (Cr), tantalum (Ta), platinum (Pt), palladium (Pd), tungsten (W), gold (Au), iridium (Ir), titanium (Ti), niobium (Nb), rhodium (Rh), molybdenum (Mo), hafnium (Hf), boron (B), nitrogen (N), silicon (Si), zirconium (Zr) or vanadium (V). The method includes absorbing a portion of the incident radiation in the patterned absorber layer and directing a portion of the incident radiation that is not absorbed in the patterned absorber layer to a material to be patterned.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of using an EUV mask, the method comprising:
   exposing the EUV mask to an incident radiation, the EUV mask including:
      a substrate;
      a reflective multilayer stack on the substrate; and
      a patterned absorber layer on the reflective multilayer stack, wherein the patterned absorber layer comprises a tantalum (Ta)-based alloy including Ta and at least one alloying element selected from titanium (Ti), chromium (Cr), iron (Fe), ruthenium (Ru), cobalt (Co), molybdenum (Mo), iridium (Ir), nickel (Ni), palladium (Pd), platinum (Pt), gold (Au), tungsten (W), niobium (Nb), rhodium (Rh), hafnium (Hf), zirconium (Zr) and vanadium (V), or a nitride, oxide, oxynitride, boride or carbide of the Ta-based alloy thereof; and
   absorbing a portion of the incident radiation in the patterned absorber layer; and
   directing a portion of the incident radiation that is not absorbed in the patterned absorber layer to a material to be patterned.

2. The method of claim 1, wherein the Ta-based alloy of the patterned absorber layer further comprises at least one interstitial element selected from nitrogen (N), oxygen (O), boron (B), carbon (C), and combinations thereof.

3. The method of claim 1, wherein the patterned absorber layer further includes:
   a capping layer on the reflective multilayer stack;
   a patterned buffer layer on the capping layer, wherein the patterned absorber layer is in contact with the patterned buffer layer; and
   a hard mask layer on the patterned absorber layer, wherein the patterned absorber layer is in contact with the hard mask layer and the hard mask layer includes a hard mask material selected from SiN, TaBO, TaO, SiO, SiON, SiOB, CrON and CrN.

4. A method of using an EUV mask, the method comprising:
   exposing the EUV mask to an incident radiation, the EUV mask including:
      a substrate;
      a reflective multilayer stack on the substrate; and
      a patterned absorber layer on the reflective multilayer stack, wherein the patterned absorber layer includes a first layer of absorber material and a second layer of absorber material different from the first layer of absorber material, the first layer of the absorber material and the second layer of absorber material each comprising an alloy including one or more of niobium (Nb), rhodium (Rh) or tungsten (W) and at least one alloying element selected from tungsten (W), niobium (Nb), rhodium (Rh), hafnium (Hf), zirconium (Zr) and vanadium (V), the absorber material of the first layer having an index of refraction smaller than 0.95 and an extinction coefficient greater than 0.01;
   absorbing a portion of the incident radiation in the patterned absorber layer; and
   directing a portion of the incident radiation that is not absorbed in the patterned absorber layer to a material to be patterned.

5. The method of claim 4, wherein the exposing the EUV mask to an incident radiation includes exposing to the incident radiation, the EUV mask, wherein the EUV mask includes the absorber material of the first layer comprising an alloy including one or more of niobium (Nb), rhodium (Rh) or tungsten (W), and at least two alloying elements selected from tungsten (W), niobium (Nb), rhodium (Rh), hafnium (Hf), zirconium (Zr) and vanadium (V).

6. The method of claim 5, wherein the exposing the EUV mask to an incident radiation includes exposing to the incident radiation, the EUV mask, wherein the EUV mask includes the absorber material of the second layer comprising an alloy including niobium (Nb), rhodium (Rh) or tungsten (W), and at least two alloying elements selected from tungsten (W), niobium (Nb), rhodium (Rh), hafnium (Hf), zirconium (Zr) and vanadium (V).

7. The method of claim 6, wherein the exposing the EUV mask to an incident radiation includes exposing to the incident radiation, the EUV mask, wherein the EUV mask includes a third layer of absorber material, the absorber material of the third layer comprising an alloy including one or more of niobium (Nb), rhodium (Rh) or tungsten (W), and at least two alloying elements selected from tungsten (W), niobium (Nb), rhodium (Rh), hafnium (Hf), zirconium (Zr) and vanadium (V).

8. The method of claim 7, wherein the exposing the EUV mask to an incident radiation includes exposing to the incident radiation, the EUV mask, wherein the EUV mask includes a fourth layer of absorber material, the absorber material of the fourth layer comprising an alloy including one or more of niobium (Nb), rhodium (Rh) or tungsten (W), and at least two alloying elements selected from tungsten (W), niobium (Nb), rhodium (Rh), hafnium (Hf), zirconium (Zr) and vanadium (V).

9. The method of claim 4, wherein the exposing the EUV mask to an incident radiation includes exposing to the incident radiation, the EUV mask, wherein the EUV mask includes an absorber material of a third layer of the patterned absorber layer different in composition than the first layer and the second layer of the patterned absorber layer, the third layer comprising an alloy including niobium (Nb) and rhodium (Rh), and an alloying element of zirconium (Zr).

10. The method of claim 5, wherein the exposing the EUV mask to an incident radiation includes exposing to the incident radiation, the EUV mask, wherein the EUV mask includes an absorber material of the first layer that includes at least one interstitial element selected from nitrogen (N), oxygen (O), boron (B), carbon (C), and combinations thereof.

11. The method of claim 5, wherein the exposing the EUV mask to an incident radiation includes exposing to the incident radiation, the EUV mask, wherein the EUV mask includes an absorber material of the first layer that includes an alloy comprising tungsten (W), and at least one alloying element selected from titanium (Ti), niobium (Nb), rhodium (Rh), molybdenum (Mo), iridium (Ir), or zirconium (Zr).

12. The method of claim 6, wherein the exposing the EUV mask to an incident radiation includes exposing to the incident radiation, the EUV mask, wherein the EUV mask includes:
  a capping layer on the reflective multilayer stack;
  a patterned buffer layer on the capping layer, wherein the patterned absorber layer is in contact with the patterned buffer layer; and
  a hard mask layer on the patterned absorber layer, wherein the patterned absorber layer is in contact with the hard mask layer and the hard mask layer includes a hard mask material selected from SiN, TaBO, TaO, SiO, SiON and SiOB.

13. The method of claim 4, wherein the exposing the EUV mask to an incident radiation includes exposing to the incident radiation, the EUV mask, wherein the EUV mask includes:
  a capping layer on the reflective multilayer stack;
  a patterned buffer layer on the capping layer, wherein the patterned absorber layer is in contact with the patterned buffer layer; and
  a hard mask layer on the patterned absorber layer, wherein the patterned absorber layer is in contact with the hard mask layer and the hard mask layer includes a hard mask material selected from CrON and CrN.

14. A method of using an EUV mask, the method comprising:
  exposing the EUV mask to an incident radiation, the EUV mask including:
    a substrate;
    a reflective multilayer stack on the substrate;
    a buffer layer on the reflective multilayer stack;
    a first layer of absorber material on the buffer layer, wherein the absorber material of the first layer comprises an alloy including one or more of niobium (Nb), rhodium (Rh) or tungsten (W), and at least one alloying element selected from tungsten (W), niobium (Nb), rhodium (Rh), hafnium (Hf), zirconium (Zr) and vanadium (V); and
    a second layer of absorber material on the first layer of absorber material, wherein the absorber material of the second layer is different from the absorber material of the first layer and the absorber material of the second layer comprising an alloy including one or more of niobium (Nb), rhodium (Rh) or tungsten (W), and at least one alloying element selected from tungsten (W), niobium (Nb), rhodium (Rh), hafnium (Hf), zirconium (Zr) and vanadium (V);
  absorbing a portion of the incident radiation in the first layer of absorber material;
  absorbing a portion of the incident radiation in the second layer of absorber material; and
  directing a portion of the incident radiation that is not absorbed in the first layer of absorber material and the second layer of absorber material to a material to be patterned.

15. The method of claim 14, wherein the exposing the EUV mask to an incident radiation includes exposing to the incident radiation the EUV mask, wherein the EUV mask includes a first layer of absorber material including a plurality of openings therein.

16. The method of claim 15, wherein the exposing the EUV mask to an incident radiation includes exposing to the incident radiation, the EUV mask, wherein the EUV mask includes a second layer of absorber material including a plurality of openings therein.

17. The method of claim 14, wherein the exposing the EUV mask to an incident radiation includes exposing to the incident radiation, the EUV mask, wherein the first layer of absorbent material is amorphous and the second layer of absorbent material is amorphous.

18. The method of claim 1, wherein the Ta-based alloy in the patterned absorber layer comprises tantalum chromium (TaCr), tantalum hafnium (TaHf), tantalum iridium (TaIr), tantalum nickel (TaNi), tantalum ruthenium (TaRu), tantalum cobalt (TaCo), tantalum gold (TaAu), tantalum molybdenum (TaMo), tantalum tungsten (TaW), tantalum iron (TaFe), tantalum rhodium (TaRh), tantalum vanadium (TaV), tantalum niobium (TaNb), tantalum palladium (TaPd), tantalum zirconium (TaZr), tantalum titanium (TaTi), or tantalum platinum (TaPt).

19. The method of claim 1, wherein the patterned absorber layer comprises TaCrN, TaHfN, TaIrN, TaNiN, TaRuN, TaCON, TaAuN, TaMoON, TaWN, TaFeN, TaRhN, TaVN, TaNbN, TaPdN, TaZrN, TaTiN, or TaPtN.

20. The method of claim 1, wherein the patterned absorber layer comprises TaCrON, TaHfON, TaIrON, TaNiON, TaRuON, TaCoON, TaAuON, TaMOON, TaWON, TaFeON, TaRhON, TaVON, TaNbON, TaPdON, TaZrON, TaTiON, TaPtON.

* * * * *